US012288013B2

(12) United States Patent
Jayaraman et al.

(10) Patent No.: US 12,288,013 B2
(45) Date of Patent: Apr. 29, 2025

(54) TECHNIQUES FOR GENERATING UV-NET REPRESENTATIONS OF 3D CAD OBJECTS FOR MACHINE LEARNING MODELS

(71) Applicant: AUTODESK, INC., San Francisco, CA (US)

(72) Inventors: Pradeep Kumar Jayaraman, Toronto (CA); Thomas Ryan Davies, Toronto (CA); Joseph George Lambourne, London (GB); Nigel Jed Wesley Morris, Toronto (CA); Aditya Sanghi, Toronto (CA); Hooman Shayani, London (GB)

(73) Assignee: AUTODESK, INC., San Francisco, CA (US)

( * ) Notice: Subject to any disclaimer, the term of this patent is extended or adjusted under 35 U.S.C. 154(b) by 870 days.

(21) Appl. No.: 17/348,295

(22) Filed: Jun. 15, 2021

(65) Prior Publication Data

US 2022/0318466 A1 Oct. 6, 2022

Related U.S. Application Data

(60) Provisional application No. 63/169,070, filed on Mar. 31, 2021.

(51) Int. Cl.
*G06F 30/27* (2020.01)
*G06F 30/23* (2020.01)
(Continued)

(52) U.S. Cl.
CPC .............. *G06F 30/27* (2020.01); *G06F 30/23* (2020.01); *G06N 20/00* (2019.01); *G06T 17/10* (2013.01)

(58) Field of Classification Search
CPC .......... G06F 30/00; G06F 30/27; G06F 30/23; G06F 30/10; G06F 30/12; G06N 20/00;
(Continued)

(56) References Cited

U.S. PATENT DOCUMENTS 10,019,543 B1 7/2018 Kanthasamy et al.
10,937,237 B1 3/2021 Kim et al.
(Continued)

OTHER PUBLICATIONS

Cao, Weijuan et al., "Graph Representation of 3D CAD Models for Machining Feature Recognition with Deep Learning", Aug. 17-19, 2020, Proceedings of the ASME 2020 International Design Engineering Conferences and Computers and Information in Engineering Conference IDETC/CIE2020. (Year: 2020).*
(Continued)

*Primary Examiner* — Cedric Johnson
(74) *Attorney, Agent, or Firm* — Artegis Law Group, LLP

(57) ABSTRACT

In various embodiments, a parameter domain graph application generates UV-net representations of 3D CAD objects for machine learning models. In operation, the parameter domain graph application generates a graph based on a B-rep of a 3D CAD object. The parameter domain graph application discretizes a parameter domain of a parametric surface associated with the B-rep into a 2D grid. The parameter domain graph application computes at least one feature at a grid point included in the 2D grid based on the parametric surface to generate a 2D UV-grid. Based on the graph and the 2D UV-grid, the parameter domain graph application generates a UV-net representation of the 3D CAD object. Advantageously, generating UV-net representations of 3D CAD objects that are represented using B-reps enables the 3D CAD objects to be processed efficiently using neural networks.

20 Claims, 6 Drawing Sheets

(51) Int. Cl.
*G06N 20/00* (2019.01)
*G06T 17/10* (2006.01)

(58) Field of Classification Search
CPC ......... G06N 3/084; G06T 17/10; G06T 19/00; G06T 2119/021; G06T 15/04; G06T 17/30
USPC .......................................................... 703/2
See application file for complete search history.

(56) References Cited

U.S. PATENT DOCUMENTS

| | | | |
|---|---|---|---|
| 11,650,968 | B2 | 5/2023 | Nair et al. |
| 2015/0035826 | A1* | 2/2015 | Tuffreau ................. G06T 17/20 345/420 |
| 2016/0307098 | A1 | 10/2016 | Goel et al. |
| 2018/0053347 | A1 | 2/2018 | Fathi et al. |
| 2020/0410064 | A1 | 12/2020 | Bauer et al. |
| 2024/0104913 | A1 | 3/2024 | Redford et al. |

OTHER PUBLICATIONS

Zhang, Zhibo et al., "FeatureNet: Machining Feature Recognition Based on 3D Convolution Neural Network", Mar. 21, 2018, Computer-Aided Design 101, Elsevier Ltd. (Year: 2018).*
Extended European Search Report for Application No. 22161217.9 dated Sep. 12, 2022.
Jayaraman et al., "UV-Net: Learning from Curve-Networks and Solids", arXiv:2006.10211, Jun. 18, 2020, 15 pages.
Jayaraman et al., "UV-Net: Learning from Boundary Representations", IEEE/CVF Conference on Computer Vision and Pattern Recognition, DOI:10.1109/CVPR46437.2021.01153, Jun. 20, 2021, pp. 11698-11707.
Angrish et al., ""FabSearch": A 3D CAD Model Based Search Engine for Sourcing Manufacturing Services", Journal of Computing and Information Science in Engineering, vol. 19, No. 4, DOI: 10.1115/1.4043211, 2019, pp. 1-46.
Ansaldi et al., "Geometric modeling of solid objects by using a face adjacency graph representation", ACM SIGGRAPH Computer Graphics, vol. 19, No. 3, Jul. 22-26, 1985, pp. 131-139.
Wikipedia, "Autodesk ShapeManager", Retrieved from https://en.wikipedia.org/wiki/ShapeManager, on Aug. 30, 2021, 2 pages.
Babic et al., "A review of automated feature recognition with rule-based pattern recognition", Computers in Industry, vol. 59, No. 4, doi:10.1016/j.compind.2007.09.001, 2008, pp. 321-337.
Bronstein et al., "Geometric deep learning: Going beyond euclidean data", IEEE Signal Processing Magazine, vol. 34, No. 4, DOI: 10.1109/MSP.2017.2693418, Jul. 2017, pp. 18-42.
Cao et al., "Graph representation of 3D cad models for machining feature recognition with deep learning", In Proceedings of the ASME 2020 International Design Engineering Technical Conferences and Computers and Information in Engineering Conference, Aug. 17-19, 2020, pp. 1-11.
Chen et al., "Big Self-Supervised Models are Strong Semi-Supervised Learners", 34th Conference on Neural Information Processing Systems, In Advances in Neural Information Processing Systems, vol. 33, arXiv:2006.10029v2, 2020, 18 pages.
Chen et al., "BSP-Net: Generating Compact Meshes via Binary Space Partitioning", IEEE/CVF Conference on Computer Vision and Pattern Recognition (CVPR), arXiv:1911.06971v6, 2020, pp. 42-51.
Chen et al., "Learning Implicit Fields for Generative Shape Modeling", IEEE/CVF Conference on Computer Vision and Pattern Recognition (CVPR),arXiv:1812.02822v5, 2019, pp. 5932-5941.
Deng et al., "PPF-FoldNet: Unsupervised Learning of Rotation Invariant 3D Local Descriptors", Springer International Publishing, arXiv:1808.10322v1, 2018, pp. 620-638.

Deng et al., "PPFNet: Global Context Aware Local Features for Robust 3D Point Matching", IEEE/CVF Conference on Computer Vision and Pattern Recognition, arXiv:1802.02669v2, 2018, pp. 195-205.
Gao et al., "DeepSpline: Data-Driven Reconstruction of Parametric Curves and Surfaces", arXiv:1901.03781v1, 2019, pp. 1-13.
Geuzaine et al., "Gmsh: A 3-D finite element mesh generator with built-in pre- and post-processing facilities", International Journal for Numerical Methods in Engineering, vol. 79, No. 11, DOI: 10.1002/nme.2579, May 7, 2009, pp. 1309-1331.
Groueix et al., "A papiermache approach to learning 3d surface generation", In Proceedings IEEE Conf. on Computer Vision and Pattern Recognition (CVPR), DOI 10.1109/CVPR.2018.00030, 2018, pp. 216-224.
Gu et al., "Geometry Images", ACM Transactions on Graphics, vol. 21, No. 3, 2002, pp. 355-361.
Hanocka et al., "MeshCNN: A Network with an Edge", ACM Transactions on Graphics, vol. 38, No. 4, Article 90, DOI: https://doi.org/10.1145/3306346.3322959, Jul. 2019, pp. 90:1-90:12.
He et al., "Momentum Contrast for Unsupervised Visual Representation Learning", IEEE/CVF Conference on Computer Vision and Pattern Recognition (CVPR), arXiv:1911.05722v3, 2020, 12 pages.
Hu et al., "TriWild: Robust Triangulation with Curve Constraints", ACM Transactions on Graphics, vol. 38, No. 4, Article 52, DOI: https://doi.org/10.1145/3306346.3323011, Jul. 2019, pp. 52:1-52:15.
Joshi et al., "Graph-based heuristics for recognition of machined features from a 3D solid model", Computer-Aided Design, vol. 20, No. 2, 1988, pp. 58-66.
Kawasaki et al., "An image processing approach to feature-preserving B-spline surface fairing", Computer-Aided Design, vol. 99, DOI: https://doi.org/10.1016/j.cad.2018.01.003, 2018, pp. 1-10.
Kingma et al., "Adam: A Method For Stochastic Optimization", In 3rd International Conference on Learning Representations, ICLR, arXiv:1412.6980v9, May 7-9, 2015, 15 pages.
Koch et al., "ABC: A Big CAD Model Dataset For Geometric Deep Learning", In The IEEE Conference on Computer Vision and Pattern Recognition (CVPR), DOI 10.1109/CVPR.2019.00983, 2019, pp. 9593-9603.
Lee et al., "Partial Entity Structure: A Compact Non-Manifold Boundary Representation Based on Partial Topological Entities", In Proceedings of the Sixth ACM Symposium on Solid Modeling and Applications, 2001, pp. 159-170.
Lopes et al., "A Learned Representation for Scalable Vector Graphics", In IEEE/CVF International Conference on Computer Vision (ICCV), 2019, pp. 7930-7939.
Mescheder et al., "Occupancy Networks: Learning 3D Reconstruction in Function Space", In Proceedings IEEE Conf. on Computer Vision and Pattern Recognition (CVPR), arXiv:1812.03828v2, Apr. 30, 2019, 11 pages.
Nezis et al., "Recognizing 212d shape features using a neural network and heuristics", Computer-Aided Design, vol. 29, No. 7, 1997, pp. 523-539.
Park et al., "DeepSDF: Learning Continuous Signed Distance Functions for Shape Representation", In IEEE Conference on Computer Vision and Pattern Recognition (CVPR), arXiv:1901.05103v1, 2019, 19 pages.
Piegl et al., "The NURBS Book", Springer-Verlag, New York, NY, USA, Second edition, DOI:10.1007/978-3-642-59223-2, 1996, 649 pages.
Prabhakar et al., "Automatic form-feature recognition using neural-network-based techniques on boundary representations of solid models", Computer-Aided Design, vol. 24, No. 7, Jul. 1992, pp. 381-392.
Qi et al., "PointNet: Deep Learning on Point Sets for 3D Classification and Segmentation", In IEEE Conference on Computer Vision and Pattern Recognition (CVPR), DOI 10.1109/CVPR.2017.16, 2017, pp. 77-85.
Sanghi, Aditya, "Info3D: Representation Learning on 3D Objects using Mutual Information Maximization and Contrastive Learning", In Computer Vision—ECCV, arXiv:2006.02598v2, 2020, pp. 626-642.

(56) References Cited

OTHER PUBLICATIONS

Sederberg, Thomas W., "Computer Aided Geometric Design", BYU Faculty Publications, Jan. 10, 2012, 289 pages.
Sinha et al., "Deep Learning 3D Shape Surfaces Using Geometry Images", Springer International Publishing, DOI: 10.1007/978-3-319-46466-4 14, 2016, pp. 223-240.
Smirnov et al., "Learning manifold patch-based representations of man-made shapes", ICLR 2021, arXiv:1906.12337v3, 2021, pp. 1-24.
Smirnov et al., "Deep Parametric Shape Predictions using Distance Fields", In IEEE/CVF Conference on Computer Vision and Pattern Recognition (CVPR), DOI 10.1109/CVPR42600.2020.00064, 2020, pp. 558-567.
Su et al., "Multi-view Convolutional Neural Networks for 3D Shape Recognition", In IEEE International Conference on Computer Vision (ICCV), DOI 10.1109/ICCV.2015.114, 2015, pp. 945-953.
Vinh et al., "Information theoretic measures for clusterings comparison: Variants, properties, normalization and correction for chance", Journal of Machine Learning Research, vol. 11, No. 95, 2010, pp. 2837-2854.
Wang et al., "O-CNN: Octree-based Convolutional Neural Networks for 3D Shape Analysis", ACM Transactions on Graphics, vol. 36, No. 4, Article 72, DOI:https://doi.org/10.1145/3072959.3073608, Jul. 2017, pp. 72:1-72:11.
Wang et al., "Attribute2font: Creating fonts you want from attributes", ACM Transactions on Graphics, vol. 39, No. 4, DOI: 10.1145/3386569.3392456, May 2020, pp. 1-15.
Wang et al., "Dynamic Graph CNN for Learning on Point Clouds", ACM Transactions on Graphics vol. 1, No. 1, Article 1 , DOI: https://doi.org/10.1145/3326362, Jan. 2019, pp. 1:1-1:13.
Weiler, Kevin J., "Topological Structures for Geometric Modeling", Rensselaer Polytechnic Institute, Aug. 1986, 340 pages.
Weiler et al., "General E(2)—Equivariant Steerable CNNs", In Advances in Neural Information Processing Systems, vol. 32, arXiv:1911.08251v2, Apr. 6, 2021, 58 pages.
Wiersma et al., "CNNs on Surfaces using Rotation-Equivariant Features", ACM Transactions on Graphics, vol. 39, No. 4, Article 92, DOI: https://doi.org/10.1145/3386569.3392437, Jul. 2020, pp. 92:1-92:12.
Wu et al., "Unsupervised Feature Learning via Non-Parametric Instance Discrimination", IEEE/CVF Conference on Computer Vision and Pattern Recognition, Doi 10.1109/CVPR.2018.00393, 2018, pp. 3733-3742.
Xu et al., "How powerful are graph neural networks?", In International Conference on Learning Representations, arXiv:1810.00826v3, 2019, 17 pages.
Zhang et al., "FeatureNet: Machining feature recognition based on 3D Convolution Neural Network", Computer-Aided Design, DOI: https://doi.org/10.1016/j.cad.2018.03.006, Mar. 2, 2018, 28 pages.
Zheng et al., "Estimating Tessellation Parameter Intervals for Rational Curves and Surfaces", ACM Transactions on Graphics, vol. 19, No. 1, Jan. 2000, pp. 56-77.
Wu et al., "3D ShapeNets: A Deep Representation for Volumetric Shapes", In IEEE Conference on Computer Vision and Pattern Recognition (CVPR), 2015, pp. 1912-1920.
Non Final Office Action received for U.S. Appl. No. 17/348,314 dated Oct. 15, 2024, 42 pages.
Ronneberger et al., "U-Net: Convolutional Networks for Biomedical Image Segmentation", arXiv: 1505.04597v1, May 18, 2015, pp. 1-8.
Bharadwaj et al., "Development of a Pilot Manufacturing V Cyberinfrastructure With an Information Rich Mechanical CAD 3D Model Repository", Proceedings of the ASME 14th International Manufacturing Science and Engineering Conference, vol. 1, Jun. 10-14, 2019, pp. 1-8.
Jones et al., "Self-Supervised Representation Learning for CAD", 2023, 10 Pages.
Final Office Action received for U.S. Appl. No. 17/348,314 dated Feb. 14, 2025, 37 pages.
Non Final Office Action received for U.S. Appl. No. 17/348,338, dated Mar. 13, 2025, 65 pages.
Ramos, Diana, "Real-Life Applications of Neural Networks", https://web.archive.org/web/20201024154807/https://www.smartsheet.com/neural-network-applications, Oct. 24, 2020, 15 pages.
Pruciak, Michal, "10 Business Applications of Neural Network (With Examples!))", Ideamotive, https://www.ideamotive.co/blog/business-applications-of-neural-network, Jan. 7, 2021, 12 pages.
Verma et al., "Particle Track Reconstruction using Geometric Deep Learning", https://arxiv.org/abs/2012.08515, Dec. 22, 2020, 19 pages.
Gropp et al., "An Introduction to MPI Parallel Programming with the Message Passing Interface", Argonne National Laboratory, May 3, 2009, 48 pages.
"Wavefront OBJ—Blender Manual", The Wayback Machine, Apr. 20, 2022, 4 pages.
Yang et al., "NENN: Incorporate Node and Edge Features in Graph Neural Networks", Proceedings of the 12th Asian Conference on Machine Learning, vol. 129, May 20, 2020, pp. 593-608.
Muzahid et al., "3D Object Classification Using a Volumetric Deep Neural Network: An Efficient Octree Guided Auxiliary Learning Approach", Doi 10.1109/ACCESS.2020.2968506, vol. 8, Jan. 21, 2020, 15 pages.
Chen et al., "On Visual Similarity Based 3D Model Retrieval", https://doi.org/10.1111/1467-8659.00669, vol. 22, No. 3, Nov. 4, 2003, 10 pages.
Hamilton, William L, "Chapter 5: The Graph Neural Network Model", 2020, pp. 47-67.

\* cited by examiner

TECHNIQUES FOR GENERATING UV-NET REPRESENTATIONS OF 3D CAD OBJECTS FOR MACHINE LEARNING MODELS

CROSS-REFERENCE TO RELATED APPLICATIONS

This application claims priority benefit of the U.S. Provisional Patent Application titled, "UV-NET LEARNING FROM BOUNDARY REPRESENTATIONS," filed on Mar. 31, 2021 and having Ser. No. 63/169,070. The subject matter of this related application is hereby incorporated herein by reference.

BACKGROUND

Field of the Various Embodiments

Embodiments of the present invention relate generally to computer science and computer-aided design software and, more specifically, to techniques for generating UV-net representations of 3D CAD objects for machine learning models.

Description of the Related Art

In the context of three-dimensional ("3D") mechanical design, computer-aided design ("CAD") tools are software applications that streamline the process of generating, analyzing, modifying, optimizing, displaying, and/or documenting designs of one or more 3D CAD objects making up an overarching mechanical design. Many of these types of CAD tools represent 3D CAD objects computationally using boundary-representations ("B-reps"). Each B-rep is a collection of connected surfaces that define the boundary between the interior of a 3D CAD object and the exterior of the 3D CAD object. More specifically, a B-rep specifies discrete topological entities, connections between the topological entities, and continuous geometric entities that describe shapes associated with the topological entities. The primary types of topological entities in a B-rep include, without limitation, a face, an edge, and a vertex. A face in a B-rep is a bounded portion of a surface, an edge in a B-rep is a bounded portion of a curve, and a vertex of a B-rep lies at a point. Some examples of the types of geometric entities that can be used to describe the different surfaces in a B-rep include, without limitation, a plane, a sphere, a cylinder, a cone, a torus, and a mathematical model known as a Non-Uniform Rational B-Splines ("NURBS") surface.

One drawback of B-reps is that processing B-reps using neural networks can be quite difficult. In that regard, because B-reps can represent 3D CAD objects using many different types of topological entities and many different types of geometric entities, the data stored in B-reps or "B-rep data" is unstructured data. By contrast, a typical neural network is trained to recognize meaningful patterns in structured data and to make decisions based on those patterns to infer a final result. In general, training a conventional neural network to infer a useful final result from unstructured data, such a B-rep data, is impractical. In addition, some shapes can be mapped to different geometric entities in different B-reps. For example, the shape of a planar surface could be specified in one B-rep using a plane and in another B-rep using a NURBS surface. Accordingly, in some situations, the same 3D CAD object can be represented by multiple B-reps, where each B-rep includes a different set of geometric entities. Consequently, even if training a conventional neural network to recognize meaningful patterns in B-rep data were possible, training that neural network to generate consistent final results for each 3D CAD object, irrespective of the B-rep used to represent the 3D CAD object, would be difficult, if not impossible.

Because B-rep data cannot be processed by conventional neural networks, many CAD tools that represent 3D CAD objects using B-reps are unable to efficiently or accurately perform certain types of tasks associated with 3D CAD objects. Some examples of these types of tasks includes, without limitation, automatically classifying 3D CAD objects, automatically recognizing faces of 3D CAD objects having a characteristic form, and automatically identifying 3D CAD objects having shapes that are visually similar to a specified 3D CAD object.

As the foregoing illustrates, what is needed in the art are more effective techniques for processing B-rep data using neural networks.

SUMMARY

One embodiment of the present invention sets forth a computer-implemented method for generating UV-net representations of 3D CAD objects for machine learning models. The method includes generating a first graph based on a first B-rep of a 3D CAD object; discretizing a first parameter domain of a first parametric surface associated with the first B-rep into a first two-dimensional (2D) grid; computing at least a first feature at a first grid point included in the first 2D grid based on the first parametric surface to generate a first 2D UV-grid; and generating a first UV-net representation based on the first graph and the first 2D UV-grid.

At least one technical advantage of the disclosed techniques relative the prior art is that the disclosed techniques enable 3D CAD objects that are represented using B-reps to be processed efficiently using neural networks. In particular, because topological data and geometric features derived from a given B-rep are stored as a graph and regular grids, respectively, using the disclosed techniques, the topological data and the geometric features can be directly and efficiently processed using neural networks. Further, because each geometric feature is captured from the parameter domain of a corresponding parametric surface or parametric curve using the disclosed techniques, the geometric features are predominantly invariant with respect to how shapes are specified in B-reps. Accordingly, the same 2D UV-grids are typically extracted from each B-rep associated with a given 3D CAD object. The disclosed techniques can therefore increase the likelihood that a machine learning model generates consistent final results for each 3D CAD object irrespective of the B-reps used to represent the 3D CAD object. These technical advantages provide one or more technological advancements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one of skilled in the art that the inventive concepts may be practiced without one or more of these specific details. For explanatory purposes, multiple instances of like objects are denoted with reference numbers identifying the object and parenthetical numbers identifying the instance where needed.

System Overview

Figure 1:
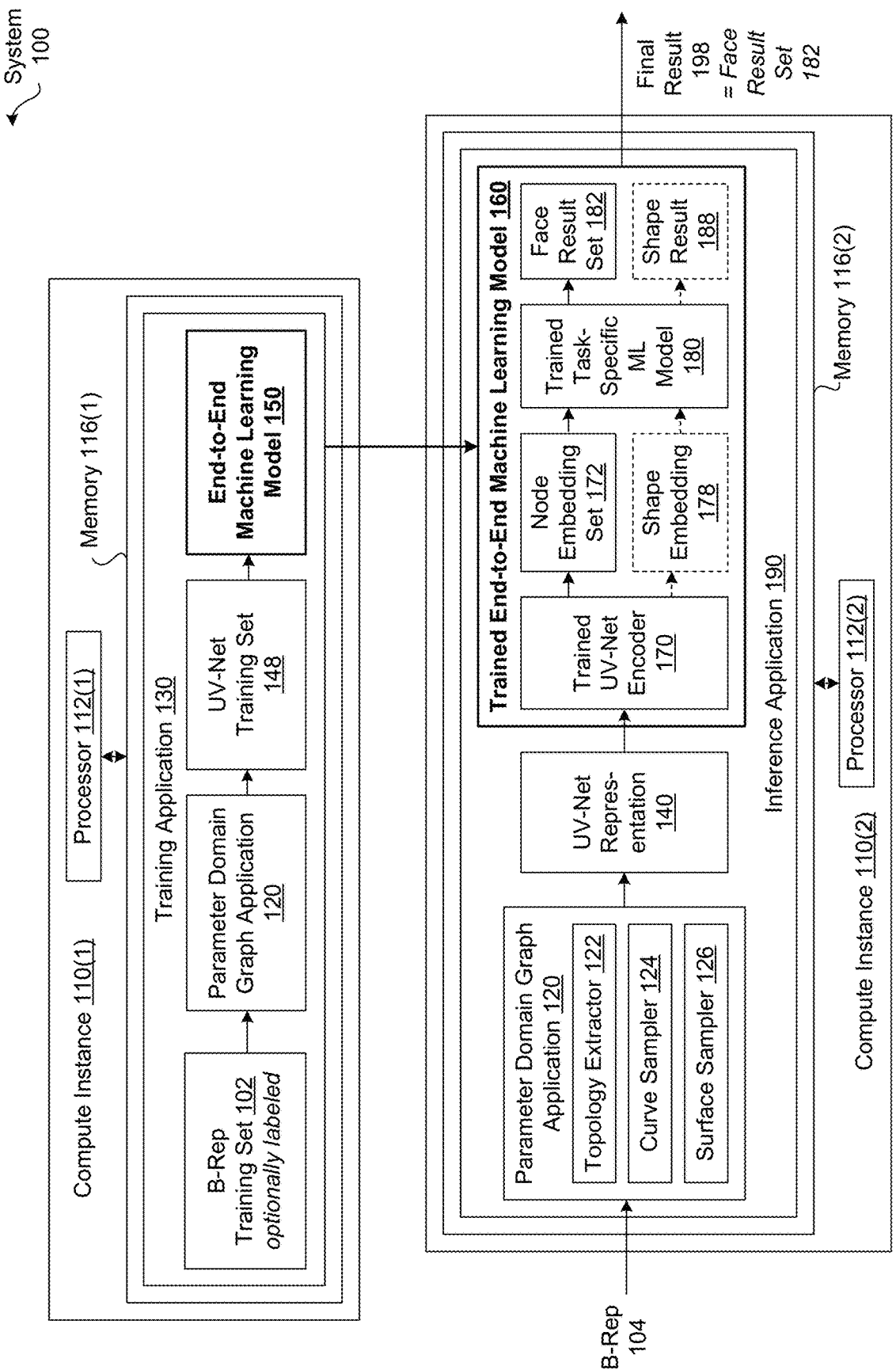
FIG. 1 is a conceptual illustration of a system configured to implement one or more aspects of the various embodiments.

FIG. 1 is a conceptual illustration of a system 100 configured to implement one or more aspects of the various embodiments. As shown, the system 100 includes, without limitation, a compute instance 110(1), a compute instance 110(2), and a B-rep 104. For explanatory purposes, the compute instance 110(1) and the compute instance 110(2) are also referred to herein individually as "compute instance 110" and collectively as "the compute instances 110." In some embodiments, the system 100 can include, without limitation, any number of compute instances 110. In various embodiments, any number of the components of the system 100 can be distributed across multiple geographic locations or implemented in one or more cloud computing environments (i.e., encapsulated shared resources, software, data, etc.) in any combination.

As shown, the compute instance 110(1) includes, without limitation, a processor 112(1) and a memory 116(1). As also shown, the compute instance 110(2) includes, without limitation, a processor 112(2) and a memory 116(2). For explanatory purposes, the processor 112(1) and the processor 112(2) are also referred to herein individually as "the processor 112" and collectively as "the processors 112." For explanatory purposes, the memory 116(1) and the memory 116(2) are also referred to herein individually as "the memory 116" and collectively as "the memory 116."

Each processor 112 can be any instruction execution system, apparatus, or device capable of executing instructions. For example, each processor 112 could comprise a central processing unit ("CPU"), a graphics processing unit ("GPU"), a controller, a microcontroller, a state machine, or any combination thereof. The memory 116 of each compute instance 110 stores content, such as software applications and data, for use by the processor 112 of the compute instance 110. In some alternative embodiments, each compute instance 110 can include any number of processors 112 and any number of memories 116 in any combination. In particular, any number of compute instances 110 (including one) can provide any number of multiprocessing environments in any technically feasible fashion.

Each memory 116 can be one or more of a readily available memory, such as random access memory (RAM), read only memory (ROM), floppy disk, hard disk, or any other form of digital storage, local or remote. In some embodiments, a storage (not shown) may supplement or replace any number of memories 116. The storage can include any number and type of external memories that are accessible to any number of processors 112. For example, and without limitation, the storage may include a Secure Digital Card, an external Flash memory, a portable compact disc read-only memory (CD-ROM), an optical storage device, a magnetic storage device, or any suitable combination of the foregoing.

Each compute instance 110 is configured to implement one or more software applications. For explanatory purposes only, each software application is depicted as residing in the memory 116 of a single compute instance 110 and executing on a processor 112 of the single compute instance 110. However, as persons skilled in the art will recognize, the functionality of each software application can be distributed across any number of other software applications that reside in the memories 116 of any number of compute instances 110 and execute on the processors 112 of any number of compute instances 110 in any combination. Further, the functionality of any number of software applications can be consolidated into a single application or subsystem.

In particular, the compute instances 110 are configured to enable machine learning models that include neural networks to efficiently and accurately performs tasks associated with 3D CAD objects represented by B-reps. In some embodiments, each B-rep is a hierarchical data structure specifying a closed, watertight shape that describes a 3D CAD object unambiguously with consistently oriented patches of surface geometry. More specifically, each B-rep includes, without limitation, any number and/or types of discrete topological entities, connections between the topological entities, continuous geometric entities that describe shapes associated with the topological entities, and references allowing efficient navigation between adjacent entities. The primary types of topological entities in B-reps include, without limitation, a face, an edge, and a vertex.

In some embodiments, each face in each B-rep is a visible portion of a parametric surface and is delimited by one or more loops of half-edges. Some examples of types of geometric entities that can be used to describe parametric surfaces associated with faces are a plane, a sphere, a cylinder, a cone, a torus, a NURBS surface, and a Bezier surface. In some embodiments, anti-clockwise loops define outer boundaries of faces and clockwise loops define internal holes of faces. Any number of half-edges can each be associated with a twin-half-edge which bounds a neighboring face and has the opposite direction.

In the same or other embodiments, each edge in each B-rep is a visible interval of a parametric curve where two faces meet. Some examples of types of geometric entities that can be used to describe parametric curves associated with edges are a line, a circle, an ellipse, a hyperbola, parabola, a NURBS curve, and a Bezier curve. In the same or other embodiments, each vertex in each B-rep is a point at which two edges meet.

As described previously herein, a significant drawback of B-reps, quite difficult. In that regard, training a conventional neural network to infer a useful result from unstructured data, such as B-rep data stored in B-reps, is impractical.

Furthermore, some shapes can be mapped to different geometric entities in different B-reps. Consequently, even if training a conventional neural network to recognize meaningful patterns in B-rep data were possible, training that neural network to generate consistent final results for each 3D CAD object, irrespective of the B-rep used to represent the 3D CAD object, would be difficult, if not impossible. Because B-rep data cannot be processed by conventional neural networks, many CAD tools that represent 3D CAD objects using B-reps are unable to efficiently or accurately perform certain types of tasks associated with 3D CAD objects.

Evaluating B-Reps Using Neural Networks

To address the above limitations of B-reps, the system 100 includes, without limitation, a parameter domain graph application 120, a training application 130, an inference application 190, or any combination thereof. The parameter domain graph application 120 extracts topological data and geometric features from B-reps to generate UV-net representations that are amenable to processing using neural networks. The training application 130 uses the parameter domain graph application 120 to generate a trained end-to-end machine learning model 160 based on a B-rep training set 102. The trained end-to-end machine learning model 160 includes, without limitation, trained any number and/or types of neural networks that, together, map UV-net representations to final results. Each final result can include, without limitation, any amount and/or types of data that is relevant to a task associated with 3D CAD objects. The inference application 190 uses the parameter domain graph application 120 and the trained end-to-end machine learning model 160 to generate final results for 3D CAD objects represented by B-reps.

For explanatory purposes, the functionality of the parameter domain graph application 120 is described in FIG. 1 in the context of generating a UV-net representation 140 based on the B-rep 104. In some embodiments, the UV-net representation 140 includes, without limitation, an face-adjacency graph (not shown in FIG. 1), a different 1D UV-grid (not shown in FIG. 1) for every edge in the B-rep 104 that is shared between two faces in the B-rep 104, and a different 2D UV-grid (not shown in FIG. 1) for every face in the B-rep 104. As shown, in some embodiments, the parameter domain graph application 120 includes, without limitation, a topology extractor 122, a curve sampler 124, and a surface sampler 126.

In some embodiments, the topology extractor 122 captures topological data from the B-rep 104 as the face-adjacency graph that is included in the UV-net representation 140. The face-adjacency graph includes, without limitation, nodes that represent the faces in the B-rep 104 and edges that represent the connectivity between the faces. More specifically, each edge in the face-adjacency graph is a different edge in the B-rep that is shared between two of the faces in the B-rep 104. The topology extractor 122 can generate the face-adjacency graph in any technically feasible fashion.

For instance, in some embodiments the topology extractor 122 iteratively traverses through the half-edges in the B-rep 104 to generate the face-adjacency graph. More specifically, the topology extractor 122 iteratively traverses from a current face to half-edges incident with the current face to corresponding twin-half-edges and then to neighboring faces.

Each edge in a B-rep is associated with a parametric curve that describes the shape of the edge in the B-rep. Therefore, each edge in the face-adjacency graph is associated with a parametric curve that describes the shape of the edge. Each parametric curve, denoted generically herein as C(u), is a map from an interval $[u_{min}, u_{max}] \in \mathbb{R}$ the parameter domain, to the geometry domain $\mathbb{R}^3$. Each parameter curve C(u) can be parameterized in any technically feasible fashion (e.g., as a line, a circular arc, a NURBS curve, etc.).

In some embodiments, for each edge in the face-adjacency graph, the curve sampler 124 captures any number and/or types of geometric features from the parameter domain of the corresponding parametric curve to generate the 1D UV-grid associated with the edge. In the same or other embodiments, each 1D UV-grid is a regular one-dimensional ("1D") grid of samples, where each sample corresponds to a discrete point in the corresponding parameter domain and has an attached set of curve features. As is well-known, a "regular grid" is a grid for which the grid lines have a constant distance along each grid axis. As described in greater detail below, each set of curve features can specify any number and/or types of features of the associated curve and/or any number and/or types of features of the faces adjacent to the associated curve. The features included in a set of curve features are also referred to herein as "curve features." The curve sampler 124 can generate the 1D UV-grids in any technically feasible fashion.

In some embodiments, for each edge in the face-adjacency graph, the curve sampler 124 discretizes the parameter domain of the corresponding parametric curve C(u) into a regular 1D grid of samples with a uniform step size $\delta u = (u_{max} - u_{min})/(D-1)$, where D is the number of samples (along the u dimension). The curve sampler 124 can determine D in any technically feasible fashion. In some embodiments, the parameter domain graph application 120 defines D as a single value (e.g., 10) that the curve sampler 124 and the surface sampler 126 use for sampling parametric curves and parametric surfaces, respectively, along the u dimension.

Each sample of each regular 1D grid corresponds to a discretized point in the parameter domain of the associated parametric curve. In some embodiments, for each sample of each regular 1D grid, the curve sampler 124 evaluates the associated parametric curve at the corresponding discretized point in the parameter domain, denoted herein as $u_d$, to generate a set of curve features and attaches the set of curve features to the sample. Notably, local neighborhoods in the 1D UV-grids correspond to local neighborhoods in corresponding curve geometry domains. The curve sampler 124 can compute any number and/or types of curve features in any technically feasible fashion to generate each set of curve features.

In some embodiments, the curve sampler 124 computes, without limitation, a point position in the geometry domain, optionally a tangent to a curve or "curve tangent," and optionally a "face" normal for each neighboring face to generate each set of curve features. In the same or other embodiments, curve sampler 124 uses three values to specify 3D absolute point coordinates for a point position in the geometry domain, three values to specify a 3D unit curve tangent, and three values to specify a 3D face normal.

Each node in the face-adjacency graph corresponds to a face in a B-rep 104. Each face in a B-rep is visible portion of an associated parametric surface described by a geometric entity in the B-rep. Some examples of geometric entities that can describe parametric surfaces in a B-rep are a plane, a sphere, a cylinder, a cone, a torus, a NURBS surface, and a Bezier surface. For a given face, to expose the visible portion of the associated parametric surface, the associated parametric surface is trimmed by the half-edge loops that run along the boundary of the face. Each parametric surface, denoted generically herein as S(u, v), is a map from a 2D interval $[u_{min}, u_{max}] \times [v_{min}, v_{max}] \in \mathbb{R}^2$, the parameter domain, to the geometry domain $\mathbb{R}^3$.

In some embodiments, for each node in the face-adjacency graph, the surface sampler 126 captures any number and/or types of geometric features from the parameter domain of the corresponding parametric surface to generate the 2D UV-grid associated with the node. In the same or other embodiments, each 2D UV-grid is a regular two-dimensional ("2D") grid of samples, where each sample corresponds to a discrete point in the corresponding parameter domain and has an attached set of surface features. As described in greater detail below, each set of surface features can specify any number and/or types of features of the associated surface or "surface features" that can be computed based on a parametric surface. The surface sampler 126 can generate the 2D UV-grids in any technically feasible fashion.

In some embodiments, for each node in the face-adjacency graph, the surface sampler 126 discretizes the parameter domain of the corresponding parametric surface S(u, v) into a regular 2D grid of samples with step sizes $\delta u = (u_{max} - u_{min})/(D-1)$, $\delta v = (v_{max} - v_{min})/(L-1)$ where D is the number of samples along the u dimension and L is the number of samples along the v dimension. The curve sampler 124 can determine D and L in any technically feasible fashion. In some embodiments, the parameter domain graph application 120 defines D and L as a single value (e.g., ten) that the curve sampler 124 and the surface sampler 126 use for sampling parametric curves and parametric surfaces, respectively, along each dimension. In the same or other embodiments, for each node in the adjacency graph, the surface sampler 126 selects the intervals $[u_{min}, u_{max}]$ and $[v_{min}, v_{max}]$ such that the intervals closely bound the loop that defines the visible region of the corresponding face in the B-rep 104.

Each sample of each regular 2D grid corresponds to a grid point in the parameter domain of the associated parametric surface. For each sample of each regular 2D grid, the surface sampler 126 evaluates the associated parametric surface at the corresponding grid point in the parameter domain, index by $(u_d, v_i)$, to generate a set of surface features and attaches the set of surface features to the sample. Notably, local neighborhoods in the 2D UV-grids correspond to local neighborhoods in corresponding surface geometry domains. The surface sampler 126 can compute any number and/or types of surface features in any technically feasible fashion to generate each set of surface features.

In some embodiments, the surface sampler 126 computes, without limitation, a point position in the geometry domain, optionally a surface normal, and a visibility flag to generate each set of curve features. In some embodiments, the surface sampler 126 uses three values to specify 3D absolute point coordinates for a point position in the geometry domain, where the scale of the 3D CAD object represented by the B-rep 104 in normalized into a cube of a fixed-size (e.g., 2) and centered at an origin. In the same or other embodiments, the surface sampler 126 uses three values to specify a 3D absolute surface normal $S_u(u_d, v_l) \times S_v(u_d, v_l)/\|S_u(u_d, v_l) \times S_v(u_d, v_l)\|$. If the parametric surface S(u, v) uses a left-hand coordinate system XOR the corresponding face is reversed, then the surface sampler 126 flips the direction of the 3D absolute surface normal. In some embodiments, the surface sampler 126 uses one value to specify a visibility flag. If a given sample is in the visible region of the corresponding surface, then the surface sampler 126 sets the visibility flag corresponding to the sample to one. Otherwise, the surface sampler 126 sets the visibility flag corresponding to the sample to zero. The visibility flag is also referred to herein as a "trimming mask."

In some embodiments, the number and/or types of surface features, the number and/or types of curve features, or both are tailored to facilitate one or more tasks via the trained end-to-end machine learning model 150. For instance, in some embodiments, to facilitate classifying shapes of 3D CAD objects, each set of curve features includes, without limitation, three values that specify a point position in the geometry domain. And each set of surface features includes, without limitation, four values that collectively specify a point position in the geometry domain and a visibility flag.

In some other embodiments, to facilitate segmenting the faces of 3D CAD objects, each set of curve features includes, without limitation, a total of twelve values that collectively specify a point position in the geometry domain, a curve tangent, and a different face normal for each of two neighboring faces. And each set of surface features includes, without limitation, seven values that collectively specify a point position in the geometry domain, a surface normal, and a visibility flag.

Advantageously, the 2D UV-grids and the 1D UV-grids are predominantly invariant with respect to how surfaces and curves, respectively, are specified in B-reps. For instance, the parameter domain graph application 120 usually computes the same 2D UV-grid for a given planar grid irrespective of whether the planar surface is specified in a B-rep using a plane or a NURBS surface. In another example, the parameter domain graph application 120 usually computes the same 1D UV-grid irrespective of whether degree elevation, knot insertion, or both have been performed on a NURBS curve. Accordingly, the parameter domain graph application 120 usually extracts the same 2D UV-grids from each of any number of B-reps that represent the same 3D CAD object. The likelihood that B-reps that represent the same 3D CAD object are interchangeable with respect to trained end-to-end machine learning model 160 is therefore increased. And the likelihood that the trained end-to-end machine learning model 160 generates consistent final results for each 3D CAD object irrespective of the B-reps used to represent the 3D CAD object is therefore increased.

In some embodiments, to increase the likelihood that the trained end-to-end machine learning model 150 generates consistent final results for the same 3D CAD object irrespective of the orientation of the 3D CAD object, the parameter domain graph application 120 computes surface features and curve features that are inherently invariant to rotation. For instance, in some embodiments, the parameter domain graph application 120 computes distances and angles to the center of each regular grid instead of points and normals, respectively.

In some embodiments, the parameter domain graph application 120 aggregates the face-adjacency graph, the 1D UV-grids, and the 2D UV-grids associated with the B-rep 104 to generate the UV-net representation 140. In some embodiments, the parameter domain graph application 120 specifies associations between the 1D UV-grids and 2D UV-grids and the edges and the nodes in the face-adjacency graph, respectively. The parameter domain graph application 120 can specify associations between the 1D UV-grids and 2D UV-grids and the edges and the nodes in the face-adjacency graph, respectively, in any technically feasible fashion. For instance, in some embodiments, the parameter domain graph application 120 orders the 1D UV-grids in the same order as the corresponding edges and orders the 2D UV-grid in the same order as the corresponding nodes.

In some embodiments, the parameter domain graph application 120 stores any number of UV-net representations in any number and/or types of memories. In the same or other embodiments, the training application 130 transmits any number of UV-net representations to any number and/or types of software applications. In some embodiments, any number of instances of the parameter domain graph application 120 are integrated into any number and/or types of software applications (e.g., the training application 130 and the inference application 190).

As shown, in some embodiments, a training application 130 resides in the memory 116(1) of the compute instance 110(1) and executes on the processor 112(1) of the compute instance 110(1). The training application 130 generates the trained end-to-end machine learning model 160 based on the B-rep training set 102. The B-rep training set 102 includes, without limitation, any number of B-reps that are optionally labeled with any amount and/or types of ground-truth data in any technically feasible fashion. For instance, in some embodiments, each face in each of the B-reps included in the B-rep training set 102 is associated with a different face label. In the same or other embodiments, each of the B-reps included in the B-rep training set 102 is associated with a different shape label.

As shown, in some embodiments, the training application 130 includes, without limitation, the parameter domain graph application 120, a UV-net training set 148, and an end-to-end machine learning model 150. The UV-net training set 148 includes, without limitation, any number of UV-grid representations. The training application 130 can generate the UV-net training set 148 in any technically feasible fashion. In some embodiments, for each B-rep included in the B-rep training set 102, the training application 130 configures the parameter domain graph application 120 to generate a corresponding UV-net representation. In the same or other embodiments, to increase the likelihood that the trained end-to-end machine learning model 160 is invariant to rotation, the training application 130 randomly rotates each B-rep included in the B-rep training set 102 and configures the parameter domain graph application 120 to generate UV-net representations corresponding to the resulting rotated B-reps.

The training application 130 can configure any number of instances of the parameter domain graph application 120 to generate any number of UV-net representations sequentially, concurrently, or in any combination thereof. The training application 130 then aggregates the UV-net representations corresponding to the B-reps included in the B-rep training set 102 to generate the UV-net training set 148.

The training application 130 generates the trained end-to-end machine learning model 160 based on, without limitation, end-to-end machine learning model 150, the UV-net training set 148, any amount (including none) and/or types of ground truth data (e.g., labels). In some embodiments, the end-to-end machine learning model 150 maps a UV-net representation to a final result that is associated with any type of task. In the same or other embodiments, the end-to-end machine learning model 150 includes, with limitation, a UV-net encoder (not shown) and any number (including zero) and/or types of other machine learning models.

The UV-net encoder maps a UV-net representation to a node embedding set and optionally a shape embedding. The node embedding set includes, without limitation, a node embedding (not shown in FIG. 1) for each node of the UV-net representation. The UV-net encoder includes, without limitation, any number and/or types of neural networks that can operate individually, collectively, or any combination thereof on regular grids (e.g., images), a graph neural network, or any combination thereof. Some examples of types of neural networks that are well suited to operating directly on regular grids include, without limitation, convolutional neural networks ("CNNs"), multilayered perceptrons ("MLPs"), and any other type of neural networks that operates directly on images.

In some embodiments, the UV-net encoder includes, without limitation, a surface CNN and a curve CNN that are followed by a graph neural network. For explanatory purposes, the functionality of the surface CNN, the curve CNN, and the graph neural network are described herein in the context of the UV-net encoder that maps a UV-net representation to a node embedding set and optionally a shape embedding. In some embodiments, the surface CNN maps the 2D UV-grids included the UV-net representation to node feature vectors. In the same or other embodiments, the weights of the surface CNN are shared among the 2D UV-grids of the UV-net representation and, as a result, the surface CNN is permutation-invariant with respect to the order of the UV-grids included in the UV-net representation. In some embodiments, the surface CNN is a group equivariant convolutional network that is invariant with respect to the four possible ways each surface can be parameterized (i.e., the four choices of uv=(0,0)).

In some embodiments, the curve CNN maps the 1D UV-grids included in the UV-net representation to edge feature vectors. In the same or other embodiments, the weights of the curve CNN are shared among the 1D UV-grids of the UV-net representation and, as a result, the curve CNN is permutation-invariant. The graph neural network maps the face-adjacency graph that specifies the nodes and edges in the UV-net representation, the node feature vectors associated with the nodes, and the edge feature vectors associated with the edges to the node embedding set and optionally the shape embedding.

In some embodiments, including the embodiment depicted in FIG. 1, the end-to-end machine learning model 150 includes, without limitation, the UV-net encoder followed by a task-specific ML model (not shown). The task-specific ML model includes, without limitation, any number and/or types of machine learning models (e.g., neural networks, etc.) that can be trained to perform one or more tasks associated with 3D CAD objects originally represented by B-reps.

In the same or other embodiments, the trained end-to-end machine learning model 160 maps a UV-net representation to a final result that includes, without limitation a node embedding set, a shape embedding, a face result set, a shape result, or any combination thereof. The face result set includes, without limitation, any type of face result for each node in the node embedding set and therefore for each face in the corresponding B-rep. As described previously herein, the UV-net encoder maps the UV-net representation to the node embedding set and optionally the shape embedding. Subsequently, the task-specific ML model maps the node embedding set and optionally the shape embedding to the face result set and optionally the shape result. The face result set includes, without limitation, a face result for each node in the node embedding set and therefore for each face in the corresponding B-rep.

In some embodiments, the training application 130 implements any number and/or types of supervised learning techniques to generate the trained end-to-end machine learning model 160 based on the UV-net representations included in the UV-net training set 148 and any number and/or types of labels associated with the corresponding B-reps. For instance, in some embodiments, the training application 130 uses end-to-end learning techniques to train the end-to-end machine learning model 150 to map the UV-net representations included in the UV-net training set 148 to final results based on and/or types of labels. In the same or other embodiments, each UV-net representation included in the UV-net training set 148 is labeled with a different face label for each face, a shape label, or both face labels and shape labels.

In general, as the training application 130 performs machine learning operations on the end-to-end machine learning model 150, the training application 130 jointly updates or "learns" the values of any learnable parameters (e.g., weights, biases, etc.) included at any level of hierarchy within the end-to-end machine learning model 150. For instance, in some embodiments, the training application 130 jointly learns the learnable parameters of the surface CNN, the curve CNN, the graph neural network, and the task-specific ML model based on final results. For explanatory purposes, final results generated and output from the end-to-end machine learning model 150 during training (e.g., during forward propagation) are also referred to herein as "preliminary results." The training application 130 can implement any number and/or types of machine learning algorithms to update any number of parameters of the end-to-end machine learning model 150 based on any number of preliminary results, any number and/or types of other results, any amount and/or types of ground truth data (e.g., any number and/or types of labels), any number and/or types of loss functions, any other type of relevant data, or any combination thereof.

For instance, in some embodiments, the training application 130 can compute an error based on any number of preliminary results associated with any number of the UV-net representations included in the UV-net training set 148 and any number and/or types of labels associated with the corresponding B-reps. The training application 130 performs any number of backpropagation operations and any number of gradient descent operations to update any number of learnable parameters of the end-to-end machine learning model 150.

In some embodiments, the training application 130 continues to update learnable parameters until the training application 130 determines that the end-to-end machine learning model 150 is trained to perform an associated task. At any given point-in-time, the training application 130 can determine whether a current version of the end-to-end machine learning model 150 is trained to perform the associated task in any technically feasible fashion. For instance, in some embodiments, the training application 130 determines whether the end-to-end machine learning model 150 is trained to perform the associated task based on any number of preliminary results, any number and/or types of other results, any amount and/or types of ground truth data (e.g., any number and/or types of labels), any number and/or types of loss functions, any other type of relevant data, or any combination thereof.

In some embodiments, the post-training version of the end-to-end machine learning model 150 includes post-training versions of the UV-net encoder and the task-specific ML model that have final or "learned" values for the learnable parameters. The post-training versions of the end-to-end machine learning model 150, the UV-net encoder, and the task-specific ML model are also referred to herein as the trained end-to-end machine learning model 160, a trained UV-net encoder 170, and a trained task-specific machine learning ("ML") model 180, respectively.

In some embodiments, the training application 130 implements any number and/or types of unsupervised learning techniques, to generate the trained end-to-end machine learning model 160. Some examples of unsupervised learning techniques include, without limitation, constructive learning techniques and techniques for implementing and training autoencoders. In some embodiments, the end-to-end machine learning model 150 is the UV-net encoder and the trained end-to-end machine learning model 160 is the trained UV-net encoder 170. In the same or other embodiments, the training application 130 trains the UV-net encoder to map a UV-net representation to a node embedding set, a shape embedding, or both a node embedding set and a shape embedding.

For instance, in some embodiments, the training application 130 implements any number and/or types of contrastive learning techniques to train the UV-net encoder to cluster shape embeddings of 3D CAD objects that look similar, while pushing apart shape embeddings of 3D CAD objects that look dissimilar. More specifically, in some embodiments, the training application 130 implements any number/ and or types of transformation operations on the UV-net representations included in the UV-net training set 148 to generate positive pairs of positive views. In some embodiments, some examples of transformations operations that the training application 130 can execute on the UV-net representations include, without limitation, extracting connected patches, randomly dropping nodes, randomly dropping edges. In the same or other embodiments, the training application 130 can execute, without limitation, any number and/or types of geometric transforms (e.g., rotation, isotropic scaling, anisotropic scaling, etc.) and/or perform any number and/or types of cropping operations (e.g., using Boolean intersection operation capabilities of a solid modeling kernel) on any number of the UV-net representations. In some embodiments, the training application 130 can perform Boolean addition operations, Boolean subtraction operations, intersection operations, random geometric transformation operations, or any combination thereof on any number of the UV-net representations to generate any number of new UV-net representations. In the same or other embodiments, the training application 130 can offset any number of the UV-net representations to generate new UV-net representations that are similar but can have different topologies. In some embodiments, the training application 130 uses the parameter domain graph application 120 and a 3-layer MLP projection head to map the positive pairs to latent vectors.

In some embodiments, the training application 130 uses normalized temperature-scaled cross-entropy as a contrastive loss function. In the same or other embodiments, the training application 130 computes a normalized temperature scaled cross-entropy loss based on the latent vectors of positive pairs. The training application 130 then performs any number of backpropagation operations and any number of gradient descent operations on the UV-net encoder and the MLP projection head based on the normalized temperature scaled cross-entropy loss to update the learnable parameters of the UV-net encoder and the MLP projection head. Advantageously, in some embodiments, when the UV-net encoder is trained to cluster shape embedding of 3D CAD objects that look similar, the trained end-to-end machine learning model 160 can be used to automatically identify 3D CAD objects having shapes that are visually similar to a specified 3D CAD object.

In some embodiments, the training application 130 stores the trained end-to-end machine learning model 160 in any number and/or types of memories. In the same or other embodiments, the training application 130 transmits the trained end-to-end machine learning model 160 to any number and/or types of software application (e.g., the inference application 190).

As shown, in some embodiments, the inference application 190 resides in the memory 116(2) of the compute instance 110(2) and executes on the processor 112(2) of the compute instance 110(1). The inference application 190 uses the parameter domain graph application 120 and the trained end-to-end machine learning model 160 to generate final results associated with 3D CAD objects based on B-reps of the 3D CAD objects. For explanatory purposes, the inference application 190 and the trained end-to-end machine learning model 160 are depicted in FIG. 1 in the context of generating a final result 198 associated with a 3D CAD object based on B-rep 104 of the 3D CAD object.

As shown, in some embodiments, the inference application 190 includes, without limitation, the parameter domain graph application 120, the UV-net representation 140, and the trained end-to-end machine learning model 160. In some embodiments, the inference application 190 can acquire (e.g., receive from the training application 130, retrieve from a memory, etc.) the trained end-to-end machine learning model 160 in any technically feasible fashion. The inference application 190 configures the parameter domain graph application 120 to generate the UV-net representation 140 based on the B-rep 104. the parameter domain graph application 120, according to some embodiments, is described in greater detail below in conjunction with FIG. 2.

Subsequently, the inference application 190 inputs the UV-net representation 140 into the trained end-to-end machine learning model 160. In response, and as described previously herein, the trained end-to-end machine learning model 160 outputs the final result 198 for the 3D CAD object originally represented by the B-rep 104. The final result 198 includes, without limitation, a face result set 182, a shape result 188, a node embedding set 172, a shape embedding 178, or any combination thereof.

As shown, in some embodiments, the trained end-to-end machine learning model 160 includes, without limitation, the trained UV-net encoder 170 and the trained task-specific ML model 180. For explanatory purposes, the trained UV-net encoder 170 and the trained task-specific ML model 180 are depicted in FIG. 1 in the context of generating the final result 198 associated with a 3D CAD object based on the UV-net representation 140. The trained UV-net encoder 170 maps the UV-net representation 140 to a node embedding set 172 and optionally a shape embedding 178. The node embedding set 172 includes, without limitation, a node embedding for each face in the B-rep 104. The trained UV-net encoder 170, according to some embodiments, is described in greater detail below in conjunction with FIG. 3.

The trained task-specific ML model 180 includes, without limitation, any number and/or types of neural networks that are trained to perform any number and/or types and/or solve any number and/or type of problems associated with 3D CAD objects. The trained task-specific ML model 180 maps the node embedding set 172 and optionally the shape embedding 178 to the face result set 182, the shape result 188, or both the face result set 182 and the shape result 188.

In some embodiments, the trained task-specific ML model 180 is a non-linear classifier (e.g., a two-layer MLP) that is trained to classify the shapes of 3D CAD objects. In the same or other embodiments, the trained task-specific ML model 180 maps the shape embedding 178 to the shape result 188 that includes, without limitation, a vector of predicted classifications known as "class logits." Advantageously, the class logits can be used to automatically identify 3D CAD objects having shapes that are visually similar to a specified 3D CAD object.

In some other embodiments, the trained task-specific ML model 180 is trained to segment the faces of 3D CAD objects. In the same or other embodiments, the trained task-specific ML model 180 concatenates the shape embedding 178 to each node embedding included in the node embedding set 172. The trained task-specific ML model 180 uses a trained non-linear classifier to map the resulting embedding concatenations to the face result set 182. The face result set 182 includes, without limitation, a different per-node logit or predicted classification for each face in the B-rep. Advantageously, the per-node logits can be used to automatically identify faces of 3D CAD objects having a characteristic form.

In some embodiments, the trained end-to-end machine learning model 160 aggregates the node embedding set 172, the shape embedding 178, the face result set 182, the shape result 188, or any combination to generate the final result 198 for the 3D CAD object originally represented by the B-rep 104. The trained end-to-end machine learning model 160 then outputs the final result 198

In some embodiments, the inference application 190 stores the final result 198 in any number and/or types of memories. In the same or other embodiments, the inference application 190 transmits the final result 198 to any number and/or types of software applications. For instance, in some embodiments, the inference application 190 transmits the final result 198 to one or more CAD applications to enable each of the CAD applications to efficiently automate any number and/or type of design tasks. In some embodiments, the final result 198 includes at least one of the node embedding set 172 or the shape embedding 178, and a CAD tool (not shown) determines one or more similarities in shape between the 3D CAD object represented by the B-rep 104 and any number of other 3D CAD objects represented by any number of other B-reps based at least in part on the final result 198.

It will be appreciated that the system shown herein is illustrative and that variations and modifications are possible. The connection topology, including the location and arrangement of the parameter domain graph application 120, the training application 130, the end-to-end machine learning model 150, the trained end-to-end machine learning model 160, the trained UV-net encoder 170, the trained task-specific ML model 180, the inference application 190, or any combination thereof can be modified as desired. In some embodiments, one or more components shown in FIG. 1 may not be present. In the same or other embodiments, the functionality of the parameter domain graph application 120, the training application 130, the end-to-end machine learning model 150, the trained end-to-end machine learning model 160, the trained UV-net encoder 170, the trained task-specific ML model 180, the inference application 190, or any combination thereof can be distributed across any number of other software applications and components that may or may not be included in the system 100.

Note that the techniques described herein are illustrative rather than restrictive, and can be altered without departing from the broader spirit and scope of the invention. Many modifications and variations will be apparent to those of ordinary skill in the art without departing from the scope and spirit of the described embodiments and techniques. Further, in various embodiments, any number of the techniques disclosed herein may be implemented while other techniques may be omitted in any technically feasible fashion.

For instance, in some embodiments, the parameter domain graph application 120 generates 2D UV-grids but does not generate 1D UV-grids, the curve CNN is omitted from the UV-net encoder, the trained curve CNN is omitted from the trained UV-net encoder 170, and the graph CNN is modified accordingly. In the same or other embodiments, the parameter domain graph application 120 does not generate 1D UV-grids and the graph neural network is replaced with an MLP. In yet other embodiments, to train the UV-net encoder to generate face encoding sets and optionally shape encoding based on topology but not geometry, the surface CNN and the curve CNN are omitted from the UV-net encoder and associated node feature vectors and edge feature vectors are replaced with noise sampled from a normal distribution.

UV-Net Representation

Figure 2:
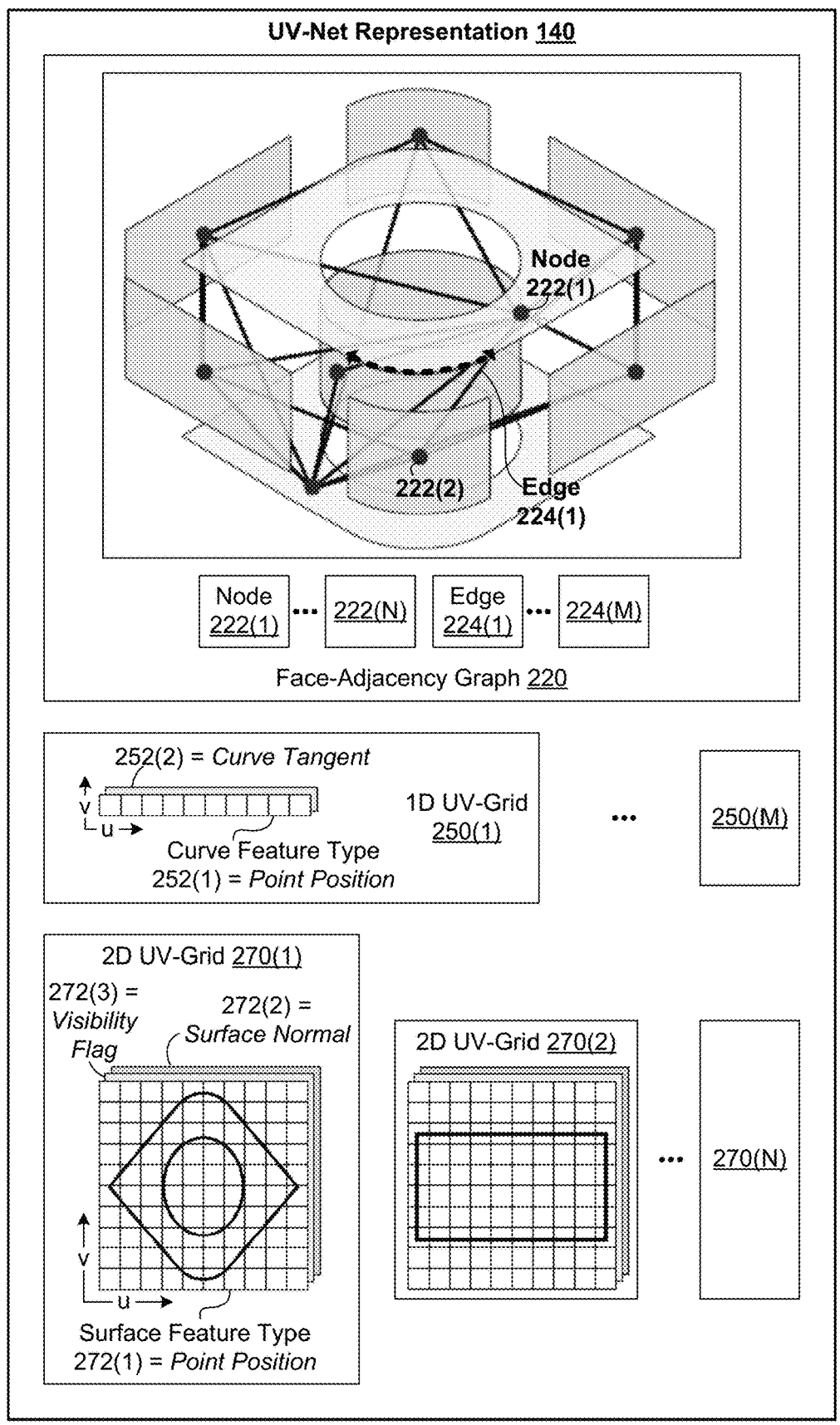
FIG. 2 is a more detailed illustration of the UV-net representation of FIG. 1, according to various embodiments.

FIG. 2 is a more detailed illustration of the UV-net representation 140 of FIG. 1, according to various embodiments. As described previously herein in conjunction with FIG. 1, the parameter domain graph application 120 generates the UV-net representation 140 based on the B-rep 104 that represents a 3D CAD object.

As shown, in some embodiments, the UV-net representation 140 includes, without limitation, an face-adjacency graph 220, 1D UV-grids 250(1)-250(M), and 2D UV-grids 270(1)-270(N), where M is the number of face in the B-rep 104 and N is the number of edges in the B-rep 104 that are shared between two faces of the B-rep 104. For explanatory purposes, the 1D UV-grids 250(1)-250(M) are also referred to herein collectively as "1D UV-grids 250" and individually as "1D UV-grid 250." The 2D UV-grids 270(1)-270(N) are also referred to herein collectively as "2D UV-grids 270" and individually as "2D UV-grid 270."

In some embodiments, the face-adjacency graph 220 includes, without limitation, nodes 222(1)-222(N) and edges 224(1)-224(M). For explanatory purposes, the nodes 222(1)-222(N) are also referred to herein collectively as "nodes 222" and individually as "node 222." The edges 224(1)-224(N) are also referred to herein collectively as "the edges 224" and individually as "the edge 224." Each of the nodes 222 corresponds to a different face in the B-rep 104. Each of the edges 224 corresponds to a different edge in the B-rep 104.

For explanatory purposes, examples of node 222(1), node 222(2), and edge 224(1) are visually depicted in the context of an exploded view of an exemplary 3D CAD object that is represented by the B-rep 104 in some embodiments. As shown, node 222(1) corresponds to a top face having a circular hole and node 222(2) corresponds to a curved side corner face. Edge 224(1) corresponds to an edge in B-rep 104 that is shared between the top face and the curved side corner face and is denoted via a heavy curved and dashed, doubled ended arrow. As shown, edge 224(1) connects node 222(1) and node 222(2).

As described previously herein, the 1D UV-grids 250 and the 2D UV-grids 270 are associated with the edges 224 and the nodes 222, respectively, of the face-adjacency graph 220. More specifically, the 1D UV-grids 250(1)-250(M) are associated with the edges 224(1)-224(M), respectively, and the 2D UV-grids 270(1)-270(N) are associated with the nodes 222(1)-222(N), respectively. The UV-net representation 140 can specify the associations between the 1D UV-grids 250 and the edges 224 and between the 2D UV-grids 270 and the nodes 222 in any technically feasible fashion. For instance, in some embodiments, the relative ordering of the 1D UV-grids 250 with respect to the edges 224 indicates the 1D UV-grid 250 that is associated with each edge 224, and the relative ordering of the 2D UV-grids 270 with respect to the nodes 222 indicates the 2D UV-grid 270 that is associated with each node 222.

As shown for the 1D UV-grid 250(1), in some embodiments, each of the 1D UV-grids 250 includes, without limitation, a 1D regular grid of ten samples (not shown) spaced uniformly along a u dimension. As described previously herein in conjunction with FIG. 1, a different curve feature set is attached to each sample in each 1D UV-grid 250. As shown, in some embodiments, each curve feature set specifies, without limitation, features for a curve feature type 252(1) of a point position and a curve feature type 252(2) of tangent. In the same or other embodiments, in the context of the curve CNN and the trained curve CNN, the number of input channels is equal to the number of values included in each curve feature set. Accordingly, in some embodiments, including the embodiment depicted in FIG. 2, each 1D UV-grid 250 specifies values at ten discretized points in an associated parameter domain for each of six channels.

As shown for the 2D UV-grid 270(1), in some embodiments, each of the 2D UV-grids 270 includes, without limitation, a ten-by-ten, 2D regular grid that interludes, without limitation, one hundred samples. As described previously herein in conjunction with FIG. 1, a different surface feature set is attached to each sample in each 2D UV-grid 270. As shown, in some embodiments, each surface feature set specifies, without limitation, features for a surface feature type 272(1) of a point position, a surface feature type 272(2) of a surface normal, and a surface feature type 272(3) of a visibility flag. In the same or other embodiments, in the context of the surface CNN and the trained surface CNN, the number of input channels is equal to the number of values included in each surface feature set. Accordingly, in some embodiments, including the embodiment depicted in FIG. 2, each 2D UV-grid 270 specifies values at one hundred grid points in an associated parameter domain for each of seven channels.

For explanatory purposes, the 2D UV-grids 270(1) and 270(2) visually depict the point positions of parametric surfaces corresponding to the nodes 222(1) and 222(2), respectively, in the context of the exploded view of the exemplary 3D CAD object depicted in conjunction with the face-adjacency graph 220. As shown in some embodiments, the visual appearance of 2D UV-grid 270(1) in the corresponding parameter domain is elongated with respect to the visual appearance of associated 3D CAD object in the geometry domain. In the same or other embodiments, the visual appearance of the 2D UV-grid 270(2) in the corresponding parameter domain is flattened with respect to the visual appearance of the associated 3D CAD object in the geometry domain.

As illustrated in FIG. 2, the face-adjacency graph 220 represents the topology of the 3D CAD object originally represented by the B-rep mode 104 as structured data that is amenable to processing using neural networks.

Generating Embeddings for 3D-Object Faces and Shapes

Figure 3:
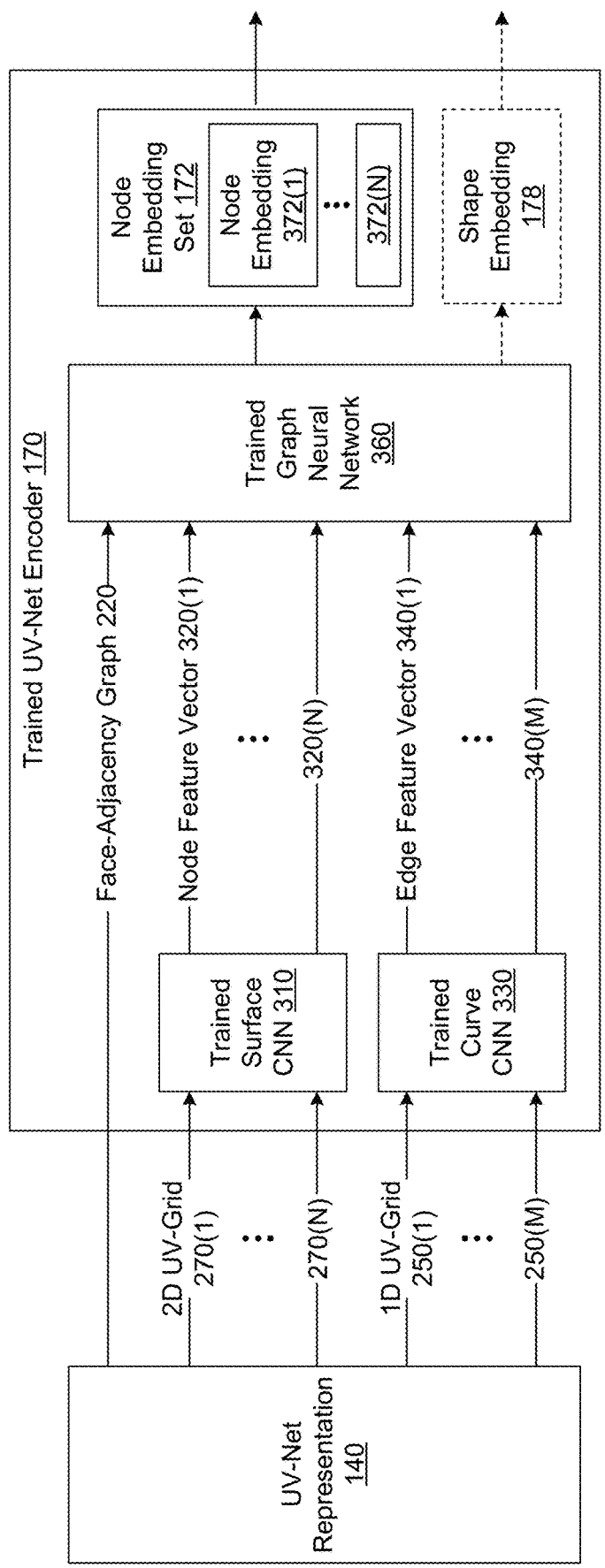
FIG. 3 is a more detailed illustration of the trained UV-net encoder of FIG. 1, according to various embodiments.

FIG. 3 is a more detailed illustration of the trained UV-net encoder 170 of FIG. 1, according to various embodiments. For explanatory purposes, the functionality of the trained UV-net encoder 170 is described in FIG. 3 in the context of mapping the UV-net representation 140 described above in conjunction with FIG. 2 to the node embedding set 172 and optionally the shape embedding 178. Referring back to FIG. 2, the UV-net representation 140 includes, without limitation, the face-adjacency graph 220, the 2D UV-grids 270(1)-270(N), and the 1D UV-grids 250(1)-250(M). More specifically, the face-adjacency graph 220 includes, without limitation, nodes 222(1)-222(N) and edges 224(1)-224(M), where N and M can be any positive integers. The UV-net representation 140 stores the 2D UV-grids 270(1)-270(N) as node attributes of the nodes 222(1)-222(N), respectively and the 1D UV-grids 250(1)-250(M) as edge attributes of the edges 224(1)-224(M), respectively.

As shown, in some embodiments, the trained UV-net encoder 170 includes, without limitation, a trained surface CNN 310, a trained curve CNN 330, a trained graph neural network 360, and the node embedding set 172. For explanatory purposes, an image convolutional layer with i input channels, o output channels, and kernel size k is denoted herein as "Conv(i, o, k)." In some embodiments, convolutional layers do not have biases and are followed by batch normalization layers and leaky rectified linear units layers. In the same or other embodiments, features are padded with size floor(k/2) to retain the spatial dimensions of the input. An adaptive average pooling layer that outputs an n×n feature map is denoted herein as "Pool(n, n)." A fully connected layer that maps a i-D vector to an o-D vector is denoted herein as "FC(i, o)." In some embodiments, fully-connected layers do not have biases and are followed by batch normalization layers and a leaky rectified linear units layers.

In some embodiments, the trained UV-net encoder 170 causes the trained surface CNN 310 to map the 2D UV-grids 270(1)-270(N) to node feature vectors 320(1)-320(N), respectively. The node feature vectors 320(1)-320(N) are associated with the nodes 222(1)-222(N), respectively. As described previously herein in conjunction with FIG. 1, in some embodiments, the weights of the trained surface CNN 310 are shared among the 2D UV-grids 270(1)-270(N) and, as a result, the trained surface CNN 310 is permutation-invariant.

The trained UV-net encoder 170 can cause the trained surface CNN 310 to map the 2D UV-grids 270(1)-270(N) to the node feature vectors 320(1)-320(N), respectively, in any technically feasible fashion. In some embodiments, the trained UV-net encoder 170 inputs the 2D UV-grids 270(1)-270(N) into any number of instances of the trained surface CNN 310. In response, the instances of the trained surface CNN 310 generate and output the node feature vectors 320(1)-320(N) sequentially, concurrently, or in any combination thereof. For instance, in some embodiments, the trained UV-net encoder 170 inputs each of the 2D UV-grids 270(1)-270(N) into a different instance of the trained surface CNN 310. In response, the N instances of the trained surface CNN 310 concurrently generate and output the node feature vectors 320(1)-320(N).

The trained surface CNN 310 can map the 2D UV-grids 270(1)-270(N) to the node feature vectors 320(1)-320(N), respectively, in any technically feasible fashion. In some embodiments, the trained surface CNN 310 performs image convolutions on the 2D UV-grids 270(1)-270(N) to generate node feature vectors 320(1)-320(N), respectively. In the context of the trained surface CNN 310, the number of input channels is equal to the number of values in each surface feature set. In some embodiments, each of the 2D UV-grids 270(1)-270(N) has 4 or 7 different channels and the trained surface CNN 310 is defined without limitation, as a sequence of layers denoted herein as Conv(4 or 7, 64, 3)→Conv(64, 128, 3)→Conv(128, 256, 3)→Pool(1, 1)→FC (256, 64).

In some embodiments, the trained UV-net encoder 170 causes the trained curve CNN 330 to map the 1D UV-grids 250(1)-250(M) to edge feature vectors 340(1)-340(M), respectively. The edge feature vectors 340(1)-340(M) are associated with the edges 224(1)-224(M), respectively. As described previously herein in conjunction with FIG. 1, in some embodiments, the weights of the trained curve CNN 330 are shared among the 1D UV-grids 250(1)-250(M) and, as a result, the trained curve CNN 330 is permutation-invariant.

The trained UV-net encoder 170 can cause the trained curve CNN 330 to map the 1D UV-grids 250(1)-250(M) to the edge feature vectors 340(1)-340(M), respectively, in any technically feasible fashion. In some embodiments, the trained UV-net encoder 170 inputs the node feature vectors 320(1)-320(N) into any number of instances of the trained surface CNN 310. In response, the instances of the trained surface CNN 310 generate and output the node feature vectors 320(1)-320(N) sequentially, concurrently, or in any combination thereof. For instance, in some embodiments, the trained UV-net encoder 170 inputs each of the node feature vectors 320(1)-320(N) into a different instance of the trained surface CNN 310. In response, the N instances of the trained surface CNN 310 concurrently generate and output the node feature vectors 320(1)-320(N).

The trained curve CNN 330 can map the 1D UV-grids 250(1)-250(M) to the edge feature vectors 340(1)-340(M), respectively, in any technically feasible fashion. In some embodiments, the trained curve CNN 330 performs image convolutions on the 1D UV-grids 250(1)-250(M) to generate the edge feature vectors 340(1)-340(M). In the context of the trained curve CNN 330, the number of input channels is equal to the number of values in each curve feature set, and the trained curve CNN 330 is defined as a sequence of 1D convolution and pooling layers.

As shown, in some embodiments, the trained UV-net encoder 170 causes the trained graph neural network 360 to map the face-adjacency graph 220, the node feature vectors 320(1)-320(N), and the edge feature vectors 340(1)-340(M) to the node embedding set 172 and optionally the shape embedding 178. The node embedding set 172 includes, without limitation, node embeddings 372(1)-372(N) that are associated with the nodes 222(1)-222(N), respectively.

The trained UV-net encoder 170 can cause the trained graph neural network 360 to map the face-adjacency graph 220, the node feature vectors 320(1)-320(N), and the edge feature vectors 340(1)-340(M) to the node embedding set 172 in any technically feasible fashion. In some embodiments, the trained UV-net encoder 170 inputs the face-adjacency graph 220, the node feature vectors 320(1)-320 (N), and the edge feature vectors 340(1)-340(M) into the trained graph neural network 360. In response, the trained graph neural network 360 generates and outputs the node embedding set 172 and optionally the shape embedding 178.

The trained graph neural network 360 can map the face-adjacency graph 220, the node feature vectors 320(1)-320(N), and the edge feature vectors 340(1)-340(M) to the node embedding set 172 in any technically feasible fashion. In some embodiments, the trained graph neural network 360 executes a message passing algorithm that propagates the node feature vectors 320 and the edge feature vectors 340 over the face-adjacency graph 220 to generate the node embedding set 172. For instance, in some embodiments, the trained graph neural network 360 treats the node feature vectors 320 and the edge feature vectors 340 as hidden node feature vectors and hidden edge feature vectors, respectively, in a graph layer 0 (i.e., an input graph layer) of the trained graph neural network 360. For explanatory purposes only, the hidden node feature vectors and the hidden edges feature vectors in graph layer k are denoted herein as $h_q^{(k)}$ and $h_{pq}^{(k)}$, respectively, where q and p are indexes into the nodes 222(1)-222(N). Note that each of the edges 224(1)-224(M) lies between a different pair of the nodes 222(1)-222(N) and therefore can be specified uniquely by a corresponding pair of node indexes.

In some embodiments, the trained graph neural network 360 includes, without limitation, a total of K graph layers, denoted herein as graph layers 1 through K, following the input graph layer, denoted herein as graph layer 0. After receiving $h_q^{(o)}$ and $h_{pq}^{(0)}$ from the trained surface CNN 310 and the trained curve CNN 330, respectively, the trained graph neural network 360 recursively computes hidden node feature vectors $h_q^{(k)}$ and hidden edge feature vectors $h_{pq}^{(k)}$ in graph layer k∈ 1 ... K.

In some embodiments, to compute hidden node feature vectors $h_q^{(k)}$ in graph layer k ∈ 1 ... K, the trained graph neural network 360 aggregates hidden node features $h_q^{(k-1)}$ from proceeding graph layer (k−1) from a one-hop neighborhood p∈ N(q) while conditioning hidden node features $h_p^{(k-1)}$ on hidden edge features $h_{pq}^{(k-1)}$ from graph layer (k−1) using equation (1):

$$h_q^{(k)} = \emptyset^{(k)}((1+\varepsilon^{(k)})h_q^{(k-1)} + \Sigma_{p\in N(q)} f_\Theta(h_{pq}^{(k-1)}) \Theta h_p^{(k-1)}) \quad (1)$$

In equation (1), $\emptyset^{(k)}$ symbolizes an MLP with FC(64, 64)→FC(64, 64), $\varepsilon^{(k)}$ symbolizes a learned parameter that distinguishes the center nodes from the neighbor nodes, and $f_\Theta$ symbolizes a linear projection from the edge feature space to the node feature space.

In the same or other embodiments, the trained graph neural network 360 computes hidden edge feature vectors $h_{pq}^{(k)}$ in graph layer k ∈ 1 ... K, while considering hidden node feature vectors $h_q^{(k-1)}$ and $h_p^{(k-1)}$ of the endpoint nodes using equation (2):

$$h_{pq}^{(k)} = \psi^{(k)}((1+\gamma^{(k)})h_{pq}^{(k-1)} + f_\Xi(h_p^{(k-1)} + h_q^{(k-1)}) \quad (2)$$

In equation (2), $\psi^{(k)}$ symbolizes an MLP with two full connected layers FC(64, 64)→FC(64, 64), $\gamma^{(k)}$ symbolizes a learned parameter that distinguishes hidden edge feature vector $h_{pq}^{(k-1)}$ from the neighboring hidden node feature vectors $h_q^{(k-1)}$ and $h_p^{(k-1)}$, and $f_\Xi$ symbolizes a linear projection from the node feature space to the edge feature space.

In some embodiments, the trained graph neural network 360 sets the node embeddings 372(1)-372(N) equal to the hidden node feature vectors $h_1^{(K)}$–$h_N^{(K)}$, respectively. The trained graph neural network 360 then outputs the node embedding set 172 that includes, without limitation, the node embeddings 372(1)-372(N). In some embodiments, each of the hidden node feature vectors $h_1^{(K)}$–$h_N^{(K)}$ and therefore each of the node embeddings 372(1)-372(N) is a 128-dimensional vector.

Optionally, in the same or other embodiments, the trained graph neural network 360 computes and outputs shape embedding 178 based on any number of the hidden node feature vectors in any technically feasible fashion. For instance, in some embodiments, the trained graph neural network 360 applies an element-wise max-pooling operation across the nodes 222(1)-222(N) to compute hierarchical graph-level feature vectors $h^{(K)}$ for k ∈ 0 . . . K using equations (3a) and (3b):

$$\{h^{(k)} \mid k \in 0 \ldots K\} \quad (3a)$$

$$h^{(k)} = maxpool_{q \in 0 \ldots N}(h_q^{(k)}) \quad (3b)$$

The trained graph neural network 360 linearly projects the hierarchical graph-level feature vectors $h^{(k)}$ into 128-dimensional vectors using learned weights $w^{(k)}$ and biases $b^{(k)}$ and sums the 128-dimensional vectors to compute shape embedding 178 denoted as $h_G$ using equation (4):

$$h_G = \Sigma_{k=1}^{K} w^{(k)} h^{(k)} + b^{(k)} \quad (4)$$

The trained UV-net encoder 170 outputs the node embedding set 172, the shape embedding 178, or both the node embedding set 172 and the shape embedding 178. As described previously herein in conjunction with FIG. 1, in some embodiments, the trained task-specific ML model 180 maps the node embedding set 172, the shape embedding 178, or both the node embedding set 172 and the shape embedding 178 to the face result set 182, the shape result 188, or both the face result set 182 and the shape result 188. Subsequently, the trained end-to-end machine learning model 160 outputs the node embedding set 172, the shape embedding 178, the face result set 182, the shape result 188, or any combination thereof as the final result 198.

As also described previously herein in conjunction with FIG. 1, in some embodiments, the training application 130 performs any number and/or types of machine learning operations on the end-to-end machine learning model 150 that includes, without limitation, a UV-net encoder, to generate the trained end-to-end machine learning model 160 that includes, without limitation, the trained UV-net encoder 170. The graph encoder is identical to the trained UV-net encoder 170 except that the trained UV-net encoder 170 specifies a learned parameter for each learnable parameter included in the trained UV-net encoder 170, where each learned parameter is the final value for the corresponding learnable parameter.

As part of training the end-to-end machine learning model 150, the training application 130 inputs each of any number of UV-net representations any number of times into the UV-net encoder. In response, the UV-net encoder executes inference operation on each UV-net representation using the same techniques described herein in conjunction with the trained UV-net encoder 170 to map the UV-net representation to a node embedding set, a shape embedding, or both a node embedding set and a shape embedding.

Figure 4:
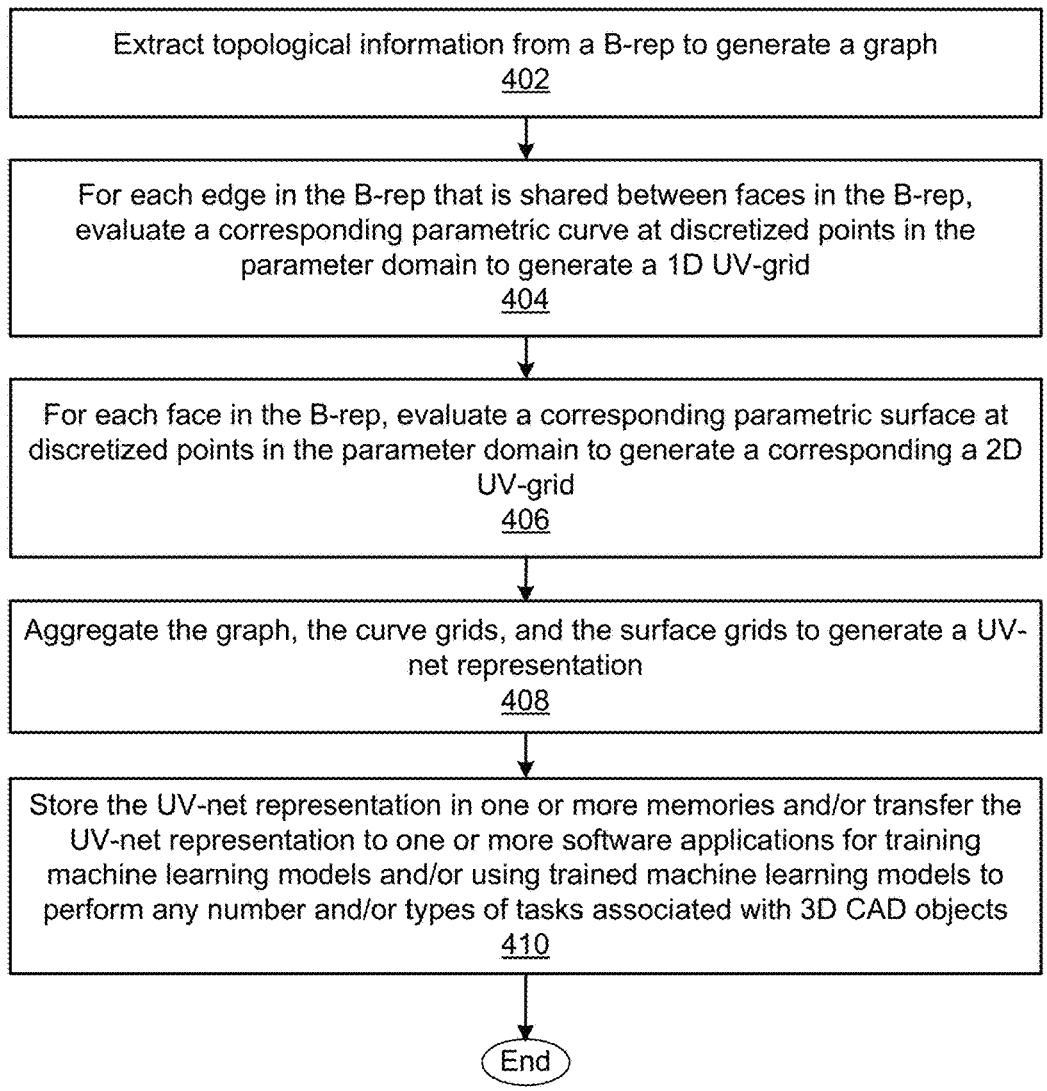
FIG. 4 is a flow diagram of method steps for generating UV-net representations of 3D CAD objects for machine learning models, according to various embodiments.

FIG. 4 is a flow diagram of method steps for generating UV-net representations of 3D CAD objects for machine learning models, according to various embodiments. Although the method steps are described with reference to the systems of FIGS. 1-3, persons skilled in the art will understand that any system configured to implement the method steps, in any order, falls within the scope of the present invention.

As shown, a method 400 begins at step 402, where the topology extractor 122 extracts topological information from B-rep 104 to generate a graph (e.g., face-adjacency graph 220). At step 404, for each edge in the B-rep 104 that is shared between faces in the B-rep 104, the curve sampler 124 evaluates a corresponding parametric curve at discretized points in the parameter domain to generate the 1D UV-grid 250. At step 406, for each face in B-rep 104, the surface sampler 126 evaluates a corresponding parametric surface at discretized points in the parameter domain to generate the 2D UV-grid 270.

At step 408, the parameter domain graph application 120 aggregates the graph, the 1D UV-grids 250, and the 2D UV-grids 270 to generate the UV-net representation 140. At step 410, the parameter domain graph application 120 stores the UV-net representation 140 in one or more memories and/or transfers the UV-net representation 140 to one or more software applications for training machine learning models and/or using trained end-to-end machine learning models to perform any number and/or types of tasks associated with 3D CAD objects. The method 400 then terminates.

Figure 5:
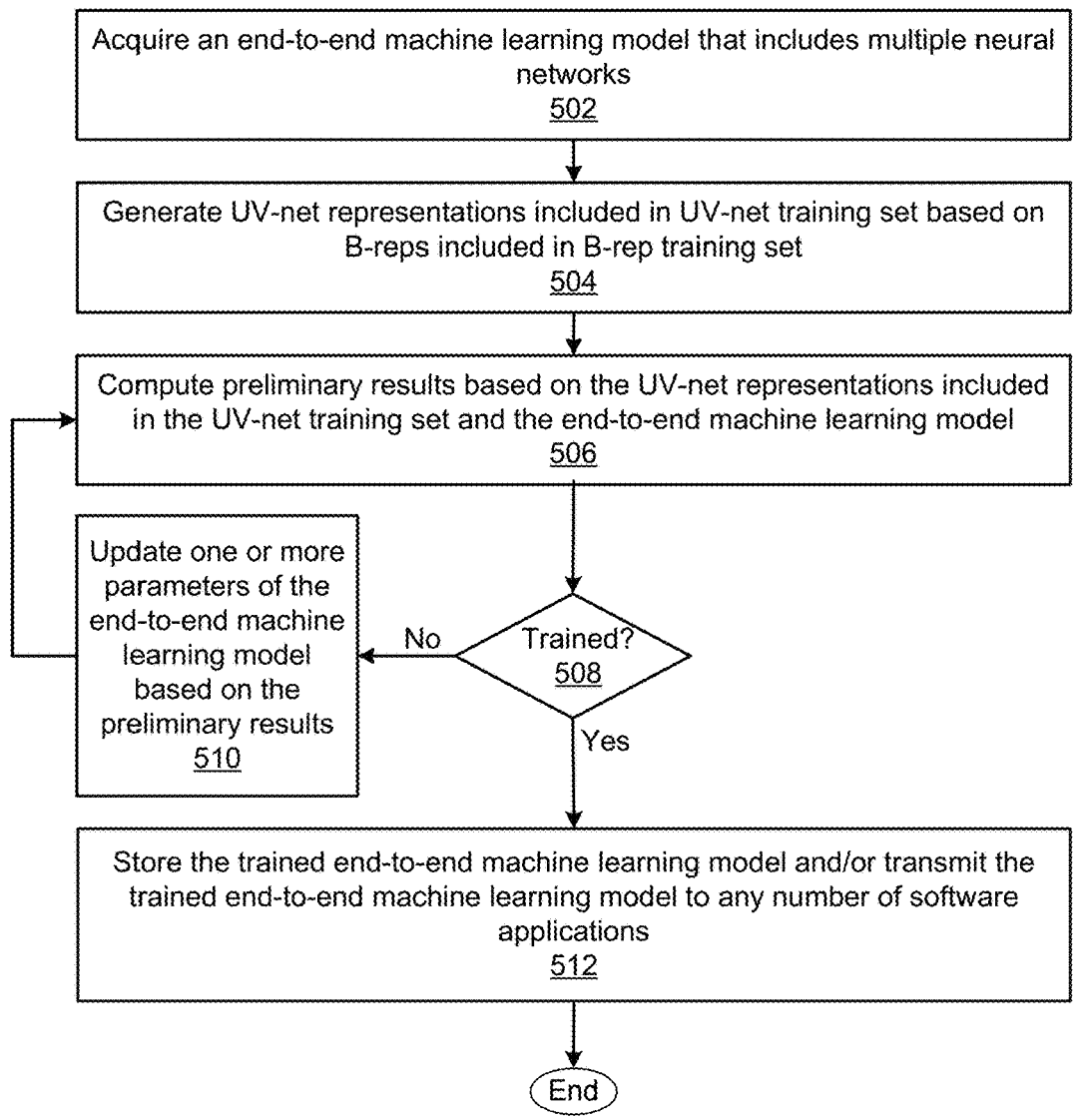
FIG. 5 is a flow diagram of method steps for training a machine learning model to perform tasks associated with 3D CAD objects that are represented using boundary-representations ("B-reps"), according to various embodiments.

FIG. 5 is a flow diagram of method steps for training a machine learning model to perform tasks associated with 3D CAD objects that are represented using boundary-representations ("B-reps"), according to various embodiments. Although the method steps are described with reference to the systems of FIGS. 1-3, persons skilled in the art will understand that any system configured to implement the method steps, in any order, falls within the scope of the present invention.

As shown, a method 500 begins at step 502, where the training application 130 acquires the end-to-end machine learning model 150 that includes, without limitation, multiple neural networks. At step 504, the parameter domain graph application 120 generates UV-net representations included in the UV-net training set 148 based on B-reps included in the B-rep training set 102. At step 506, the training application 130 computes preliminary results based on the UV-net representations included in the UV-net training set 148 and the end-to-end machine learning model 150.

At step 508, the training application 130 determines whether the end-to-end machine learning model 150 is trained to perform an associated task. The training application can determine whether the end-to-end machine learning model 150 is now trained in any technically feasible fashion. For instance, in some embodiments, the training application 130 determines whether the end-to-end machine learning model 150 is trained based at least in part, any number of preliminary results, any number and/or types of labels, a loss function, or any combination thereof.

If, at step 508, the training application 130 determines that the end-to-end machine learning model 150 is not yet trained to perform the associated task, then the method 500 proceeds to step 510. At step 510, the training application 130 updates one or more parameters of the end-to-end machine learning model 150 based, at least in part, on the preliminary results. The method 500 then returns to step 506, where the training application 130 computes preliminary results using the updated version of the end-to-end machine learning model 150. The method 500 continues to cycle through steps 506-510 until the training application 130 determines, at step 508, that the end-to-end machine learning model 150 is trained to perform the associated task.

If, at step 508, the training application 130 determines, that the end-to-end machine learning model 150 is trained to perform the associated task, then the method 500 proceeds directly to step 512. As referred to herein, an updated version of end-to-end machine learning model 150 that is trained to perform an associated task is also referred to herein as "the trained end-to-end machine learning model 150."

At step 512, the training application 130 stores the trained end-to-end machine learning model 160 in one or more memories and/or transfers the trained end-to-end machine learning model 160 to any number of software applications. The method 500 then terminates.

Figure 6:
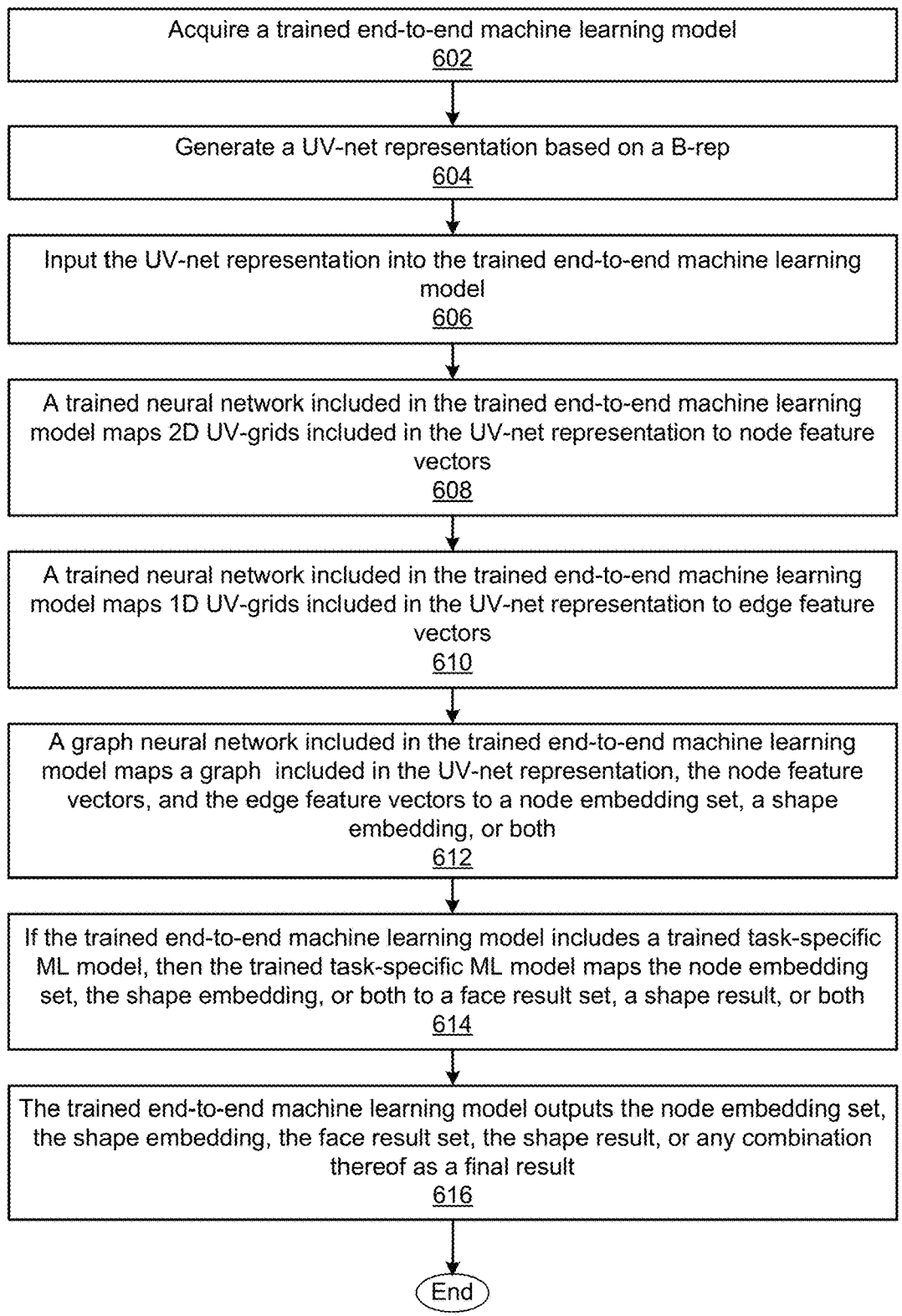
FIG. 6 is a flow diagram of method steps for performing tasks associated with 3D CAD objects represented using B-reps, according to various embodiments.

FIG. 6 is a flow diagram of method steps for performing tasks associated with 3D CAD objects represented using B-reps using a trained machine learning model, according to various embodiments. Although the method steps are described with reference to the systems of FIGS. 1-3, persons skilled in the art will understand that any system configured to implement the method steps, in any order, falls within the scope of the present invention.

As shown, a method 600 begins at step 602, where the inference application 190 acquires the trained end-to-end machine learning model 160. At step 604, the parameter domain graph application 120 generates the UV-net representation 140 based on the B-rep 104. At step 606, the inference application 190 inputs the UV-net representation 140 into the trained end-to-end machine learning model 160.

At step 608, a trained neural network (e.g., the trained surface CNN 310) maps 2D UV-grids 270(1)-270(N) included in the UV-net representation 140 to node feature vectors 320(1)-320(N), respectively. At step 610, a trained neural network (e.g., the trained curve CNN 330) maps 1D UV-grids 250(1)-250(M) included in the UV-net representation 140 to edge feature vectors 340(1)-340(M), respectively. At step 612, the trained graph neural network 360 maps a graph (e.g., the face-adjacency graph 220) included in the UV-net representation 140, the node feature vectors 320(1)-320(N), and the edge feature vectors 340(1)-340(M) to node embedding set 172, shape embedding 178, or both.

At step 614, if the trained end-to-end machine learning model 160 includes trained task-specific ML model 180, then trained task-specific ML model 180 maps node embedding set 172, shape embedding 178, or both to face result set 182, shape result 188, or both. At step 616, the trained end-to-end machine learning model 160 outputs the node embedding set 172, the shape embedding 178, the face result set 182, the shape result 188, or any combination thereof as the final result 198. The method 600 then terminates.

In sum, the disclosed techniques can be used to automate a wide variety of tasks associated with 3D CAD objects represented by B-reps. In some embodiments, a parameter domain graph application converts a B-rep of a 3D CAD object to a UV-net representation that describes salient aspects of the 3D CAD object. The UV-net representation includes, without limitation, an face-adjacency graph, 1D UV-grids that are edge attributes of the face-adjacency graph, and 2D UV-grids that are node attributes of the face-adjacency graph.

The parameter domain graph application includes, without limitation, a topology extractor, a curve sampler, and a surface sampler curve sampler. The topology extractor extracts topological data from the B-rep to generate an face-adjacency graph. The face-adjacency graph includes, without limitation, vertices representing the faces in the B-rep and edges that encode portions of curves shared between faces.

For each edge in the B-rep that is shared between faces, the curve sampler discretizes the parameter domain of a corresponding parametric curve to generate a regular 1D grid of points. The curve sampler then computes a set of curve samples at each grid point and attaches the sets of curve samples to the corresponding points to generate a 1D UV-grid corresponding to the edge. In some embodiments, each set of curve samples includes, without limitation, a 3D point position in the geometry domain.

For each node in the face-adjacency graph, the surface sampler discretizes the parameter domain of a corresponding parametric surface to generate a regular 2D grid of points. The surface sampler then computes a set of surface samples at each grid point and attaches the sets of surface samples to the corresponding grid points to generate a 2D UV-grid. In some embodiments, each set of surface samples includes, without limitation, a 3D point position in the geometry domain, a 3D surface normal, and a visibility flag.

In some embodiments, a training application trains a machine learning model to map UV-net representations to final results. Each final result includes, without limitation, a set of face results for the set of nodes in the UV-net representation, a shape result, or both. In operation, the training application converts B-reps included in a B-rep training database to UV-net representations via the parameter domain graph application. Based on the UV-net representations, the training application executes any number and/or types of machine learning algorithms to train the end-to-end machine learning model to generate a trained end-to-end machine learning model. For instance, In some embodiments, the training application implements an end-to-end supervised learning process based on any number and/or types of labels associated with the B-reps.

In the same or other embodiments, the trained end-to-end machine learning model includes, without limitation, a trained UV-net encoder and a trained task neural network. The trained UV-net encoder maps a UV-net representation to a set of node embeddings, a shape embeddings, or both. More precisely, in some embodiments, a trained surface CNN included in the trained UV-net encoder maps the 2D UV-grids included in a UV-net representation to node feature vectors. A trained surface CNN included in the trained UV-net encoder maps the 1D UV-grids included in the UV-net representation to edge feature vectors. And a graph neural network included in the trained UV-net encoder maps the face-adjacency graph included in the UV-net representation, the node feature vectors, and the edge feature vectors to the set of node embeddings, the shape embedding, or both. The trained task neural network maps the set of node embeddings, the shape embedding, or both to a face result set a shape result, or both. The trained end-to-end machine learning model outputs the set of node embeddings, the shape embedding, the set of face results, the shape result, or any combination thereof as a final result.

In some embodiments, an inference application uses the parameter domain graph application and the trained end-to-end machine learning model to generate a final result for each of any number of B-reps. For a given B-rep, the inference application converts the B-rep to a UV-net representation via the parameter domain graph application. The training application inputs the UV-net representation into the trained end-to-end machine learning model. In response, the trained end-to-end machine learning model outputs a final result corresponding to the 3D CAD object originally represented by the B-rep. In some embodiments, the final result includes, without limitation, a set of node embeddings, a shape embedding, a set of face results, a shape result, or any combination thereof.

At least one technical advantage of the disclosed techniques relative the prior art is that the disclosed techniques enable 3D CAD objects that are represented using B-reps to be processed efficiently using neural networks. In particular, because topological data and geometric features derived from a given B-rep are stored as a graph and regular grids, respectively, using the disclosed techniques, the topological data and the geometric features can be directly and efficiently processed using neural networks. Further, because each geometric feature is captured from the parameter domain of a corresponding parametric surface or parametric curve using the disclosed techniques, the geometric features are predominantly invariant with respect to how shapes are specified in B-reps. Accordingly, the same 2D UV-grids are typically extracted from each B-rep associated with a given 3D CAD object. The disclosed techniques can therefore increase the likelihood that a machine learning model generates consistent final results for each 3D CAD object irrespective of the B-reps used to represent the 3D CAD object. These technical advantages provide one or more technological advancements over prior art approaches.

1. In some embodiments, a computer-implemented method for generating UV-net representations of three-dimensional (3D) computer-aided design (CAD) objects for machine learning models comprises generating a first graph based on a first boundary-representation (B-rep) of a 3D CAD object; discretizing a first parameter domain of a first parametric surface associated with the first B-rep into a first two-dimensional (2D) grid; computing at least a first feature at a first grid point included in the first 2D grid based on the first parametric surface to generate a first 2D UV-grid; and generating a first UV-net representation based on the first graph and the first 2D UV-grid.

2. The computer-implemented method of clause 1, wherein computing the at least a first feature comprises evaluating the first parametric surface at the first grid point in the first parameter domain to determine at least one of a 3D point position in a geometry domain, a 3D surface normal, or a visibility flag.

3. The computer-implemented method of clauses 1 or 2, wherein generating the first UV-net representation comprises generating a second 2D UV-grid based on a second parametric surface associated with the first B-rep; specifying a first association between the first 2D UV-grid and a first node included in the first graph; and specifying a second association between the second 2D UV-grid and a second node included in the first graph.

4. The computer-implemented method of any of clauses 1-3, wherein generating the first UV-net representation comprises discretizing a second parameter domain of a parametric curve associated with the first B-rep into a one-dimensional (1D) grid; computing at least a second feature at a second grid point included in the 1D grid based on the parametric curve to generate a 1D UV-grid; specifying a first association between the first 2D UV-grid and a node included in the first graph; and specifying a second association between the 1D UV-grid and an edge included in the first graph.

5. The computer-implemented method of any of clauses 1-4, wherein the at least a second feature comprises at least one of a 3D point position in a geometry domain, a 3D curve tangent, a first 3D normal associated with a first face included in the first B-rep, or a second 3D normal associated with a second face included in the first B-rep.

6. The computer-implemented method of any of clauses 1-5, wherein the first parametric surface is associated with a plane specified in the first B-rep, a sphere specified in the first B-rep, a cylinder specified in the first B-rep, a cone specified in the first B-rep, a torus specified in the first B-rep, a Non-Uniform Rational B-Splines surface specified in the first B-rep, or a Bezier surface specified in the first B-rep.

7. The computer-implemented method of any of clauses 1-6, wherein generating the first graph comprises traversing a plurality of half-edges included the first B-rep to generate a plurality of edges and a plurality of nodes.

8. The computer-implemented method of any of clauses 1-7, wherein the first graph includes a plurality of nodes that correspond to a plurality of faces included in the first B-rep and a plurality of edges that represent connectivity between the plurality of faces.

9. The computer-implemented method of any of clauses 1-8, wherein discretizing the first parameter domain of the first parametric surface comprises computing a first step size based on a first dimension of the first parameter domain; computing a second step size based on a second dimension of the first parameter domain; and sampling the parameter domain with the first step size in the first dimension and the second step size in the second dimension.

10. The computer-implemented method of any of clauses 1-9, further comprising generating a second graph based on a second B-rep of the 3D CAD object; generating a second 2D UV-grid based on a second parametric surface that is associated with a geometric entity that is included in the second B-rep but not included in the first B-rep; and generating a second UV-net representation of the 3D CAD object based on the second graph and the second 2D UV-grid, wherein the second UV-net representation and the first UV-net representation are interchangeable with respect to a machine learning model.

11. In some embodiments, or more non-transitory computer readable media include instructions that, when executed by one or more processors, cause the one or more processors to generate UV-net representations of three-dimensional (3D) computer-aided design (CAD) objects for machine learning models by performing the steps of generating a first graph based on a first boundary-representation (B-rep) of a 3D CAD object; discretizing a first parameter domain of a first parametric surface associated with the first B-rep into a first two-dimensional (2D) grid; computing at least a first feature at a first grid point included in the first 2D grid based on the first parametric surface to generate a first 2D UV-grid; and generating a first UV-net representation based on the first graph and the first 2D UV-grid.

12. The one or more non-transitory computer readable media of clause 11, wherein computing the at least a first feature comprises evaluating the first parametric surface at the first grid point in the first parameter domain to determine at least one of a distance to the center of the first 2D grid, an angle to the center of the first 2D grid, or a visibility flag.

13. The one or more non-transitory computer readable media of clauses 11 or 12, wherein generating the first UV-net representation comprises generating a second 2D UV-grid based on a second parametric surface associated with the first B-rep; specifying a first association between the first 2D UV-grid and a first node included in the first graph; and specifying a second association between the second 2D UV-grid and a second node included in the first graph.

14. The one or more non-transitory computer readable media of any of clauses 11-13, wherein generating the first UV-net representation comprises discretizing a second parameter domain of a parametric curve associated with the first B-rep into a one-dimensional (1D) grid; computing at least a second feature at a second grid point included in the 1D grid based on the parametric curve to generate a 1D UV-grid; specifying a first association between the first 2D UV-grid and a node included in the first graph; and specifying a second association between the 1D UV-grid and an edge included in the first graph.

15. The one or more non-transitory computer readable media of any of clauses 11-14, wherein the parametric curve is associated with a line specified in the first B-rep, a circle specified in the first B-rep, an ellipse specified in the first B-rep, a hyperbola specified in the first B-rep, a parabola specified in the first B-rep, a Non-Uniform Rational B-Splines curve specified in the first B-rep, or a Bezier curve specified in the first B-rep.

16. The one or more non-transitory computer readable media of any of clauses 11-15, wherein the first parametric surface is associated with a plane specified in the first B-rep, a sphere specified in the first B-rep, a cylinder specified in the first B-rep, a cone specified in the first B-rep, a torus specified in the first B-rep, a Non-Uniform Rational B-Splines surface specified in the first B-rep, or a Bezier surface specified in the first B-rep.

17. The one or more non-transitory computer readable media of any of clauses 11-16, wherein generating the first graph comprises traversing a plurality of half-edges included the first B-rep to generate a plurality of edges and a plurality of nodes.

18. The one or more non-transitory computer readable media of any of clauses 11-17, wherein the first graph comprises an face-adjacency graph.

19. The one or more non-transitory computer readable media of any of clauses 11-18, wherein discretizing the first parameter domain of the first parametric surface comprises computing a first step size based on a first dimension of the first parameter domain; computing a second step size based on a second dimension of the first parameter domain; and sampling the parameter domain with the first step size in the first dimension and the second step size in the second dimension.

20. In some embodiments, a system comprises one or more memories storing instructions and one or more processors coupled to the one or more memories that, when executing the instructions, perform the steps of generating a graph based on a boundary-representation (B-rep) of a three-dimensional computer-aided design object; discretizing a first parameter domain of a parametric surface associated with the B-rep into a two-dimensional (2D) grid; computing at least a first feature at a first grid point included in the 2D grid based on the parametric surface to generate a 2D UV-grid; and generating a UV-net representation based on the graph and the 2D UV-grid.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for generating UV-net representations of three-dimensional (3D) computer-aided design (CAD) objects for machine learning models, the method comprising:
   generating a first graph based on a first boundary-representation (B-rep) of a 3D CAD object;
   discretizing a first parameter domain of a first parametric surface associated with the first B-rep into a first two-dimensional (2D) grid;
   computing at least a first feature at a first grid point included in the first 2D grid based on the first parametric surface to generate a first 2D UV-grid; and
   generating a first UV-net representation based on the first graph and the first 2D UV-grid.

2. The computer-implemented method of claim 1, wherein computing the at least a first feature comprises evaluating the first parametric surface at the first grid point in the first parameter domain to determine at least one of a 3D point position in a geometry domain, a 3D surface normal, or a visibility flag.

3. The computer-implemented method of claim 1, wherein generating the first UV-net representation comprises:
   generating a second 2D UV-grid based on a second parametric surface associated with the first B-rep;
   specifying a first association between the first 2D UV-grid and a first node included in the first graph; and
   specifying a second association between the second 2D UV-grid and a second node included in the first graph.

4. The computer-implemented method of claim 1, wherein generating the first UV-net representation comprises:
   discretizing a second parameter domain of a parametric curve associated with the first B-rep into a one-dimensional (1D) grid;
   computing at least a second feature at a second grid point included in the 1D grid based on the parametric curve to generate a 1D UV-grid;
   specifying a first association between the first 2D UV-grid and a node included in the first graph; and
   specifying a second association between the 1D UV-grid and an edge included in the first graph.

5. The computer-implemented method of claim 4, wherein the at least a second feature comprises at least one of a 3D point position in a geometry domain, a 3D curve tangent, a first 3D normal associated with a first face included in the first B-rep, or a second 3D normal associated with a second face included in the first B-rep.

6. The computer-implemented method of claim 1, wherein the first parametric surface is associated with a plane specified in the first B-rep, a sphere specified in the first B-rep, a cylinder specified in the first B-rep, a cone specified in the first B-rep, a torus specified in the first B-rep, a Non-Uniform Rational B-Splines surface specified in the first B-rep, or a Bezier surface specified in the first B-rep.

7. The computer-implemented method of claim 1, wherein generating the first graph comprises traversing a plurality of half-edges included the first B-rep to generate a plurality of edges and a plurality of nodes.

8. The computer-implemented method of claim 1, wherein the first graph includes a plurality of nodes that correspond to a plurality of faces included in the first B-rep and a plurality of edges that represent connectivity between the plurality of faces.

9. The computer-implemented method of claim 1, wherein discretizing the first parameter domain of the first parametric surface comprises:
   computing a first step size based on a first dimension of the first parameter domain;
   computing a second step size based on a second dimension of the first parameter domain; and sampling the first parameter domain with the first step size in the first dimension and the second step size in the second dimension.

10. The computer-implemented method of claim 1, further comprising:
generating a second graph based on a second B-rep of the 3D CAD object;
generating a second 2D UV-grid based on a second parametric surface that is associated with a geometric entity that is included in the second B-rep but not included in the first B-rep; and
generating a second UV-net representation of the 3D CAD object based on the second graph and the second 2D UV-grid, wherein the second UV-net representation and the first UV-net representation are interchangeable with respect to a machine learning model.

11. One or more non-transitory computer readable media including instructions that, when executed by one or more processors, cause the one or more processors to generate UV-net representations of three-dimensional (3D) computer-aided design (CAD) objects for machine learning models by performing the steps of:
generating a first graph based on a first boundary-representation (B-rep) of a 3D CAD object;
discretizing a first parameter domain of a first parametric surface associated with the first B-rep into a first two-dimensional (2D) grid;
computing at least a first feature at a first grid point included in the first 2D grid based on the first parametric surface to generate a first 2D UV-grid; and
generating a first UV-net representation based on the first graph and the first 2D UV-grid.

12. The one or more non-transitory computer readable media of claim 11, wherein computing the at least a first feature comprises evaluating the first parametric surface at the first grid point in the first parameter domain to determine at least one of a distance to the center of the first 2D grid, an angle to the center of the first 2D grid, or a visibility flag.

13. The one or more non-transitory computer readable media of claim 11, wherein generating the first UV-net representation comprises:
generating a second 2D UV-grid based on a second parametric surface associated with the first B-rep;
specifying a first association between the first 2D UV-grid and a first node included in the first graph; and
specifying a second association between the second 2D UV-grid and a second node included in the first graph.

14. The one or more non-transitory computer readable media of claim 11, wherein generating the first UV-net representation comprises:
discretizing a second parameter domain of a parametric curve associated with the first B-rep into a one-dimensional (1D) grid;
computing at least a second feature at a second grid point included in the 1D grid based on the parametric curve to generate a 1D UV-grid;
specifying a first association between the first 2D UV-grid and a node included in the first graph; and
specifying a second association between the 1D UV-grid and an edge included in the first graph.

15. The one or more non-transitory computer readable media of claim 14, wherein the parametric curve is associated with a line specified in the first B-rep, a circle specified in the first B-rep, an ellipse specified in the first B-rep, a hyperbola specified in the first B-rep, a parabola specified in the first B-rep, a Non-Uniform Rational B-Splines curve specified in the first B-rep, or a Bezier curve specified in the first B-rep.

16. The one or more non-transitory computer readable media of claim 11, wherein the first parametric surface is associated with a plane specified in the first B-rep, a sphere specified in the first B-rep, a cylinder specified in the first B-rep, a cone specified in the first B-rep, a torus specified in the first B-rep, a Non-Uniform Rational B-Splines surface specified in the first B-rep, or a Bezier surface specified in the first B-rep.

17. The one or more non-transitory computer readable media of claim 11, wherein generating the first graph comprises traversing a plurality of half-edges included the first B-rep to generate a plurality of edges and a plurality of nodes.

18. The one or more non-transitory computer readable media of claim 11, wherein the first graph comprises a face-adjacency graph.

19. The one or more non-transitory computer readable media of claim 11, wherein discretizing the first parameter domain of the first parametric surface comprises:
computing a first step size based on a first dimension of the first parameter domain;
computing a second step size based on a second dimension of the first parameter domain; and
sampling the first parameter domain with the first step size in the first dimension and the second step size in the second dimension.

20. A system comprising:
one or more memories storing instructions; and
one or more processors coupled to the one or more memories that, when executing the instructions, perform the steps of:
generating a graph based on a boundary-representation (B-rep) of a three-dimensional computer-aided design object;
discretizing a first parameter domain of a parametric surface associated with the B-rep into a two-dimensional (2D) grid;
computing at least a first feature at a first grid point included in the 2D grid based on the parametric surface to generate a 2D UV-grid; and
generating a UV-net representation based on the graph and the 2D UV-grid.

* * * * *